(12) United States Patent
Nonaka

(10) Patent No.: US 7,518,407 B2
(45) Date of Patent: Apr. 14, 2009

(54) BOOTSTRAP CIRCUIT AND DRIVING METHOD THEREOF

(75) Inventor: Yoshihiro Nonaka, Tokyo (JP)

(73) Assignee: NEC Corporation, Tokyo (JP)

( * ) Notice: Subject to any disclaimer, the term of this patent is extended or adjusted under 35 U.S.C. 154(b) by 190 days.

(21) Appl. No.: 11/274,165

(22) Filed: Nov. 16, 2005

(65) Prior Publication Data

US 2006/0103429 A1    May 18, 2006

(30) Foreign Application Priority Data

Nov. 17, 2004    (JP)    ............................. 2004-332539

(51) Int. Cl.
*H03K 19/094* (2006.01)
*H03K 19/0175* (2006.01)

(52) U.S. Cl. ............................. 326/88; 326/92; 327/390
(58) Field of Classification Search ................... 326/88, 326/92, 83, 86; 327/390, 589
See application file for complete search history.

(56) References Cited

U.S. PATENT DOCUMENTS

| | | | | |
|---|---|---|---|---|
| 3,835,457 A | * | 9/1974 | Yu | ............................... 326/70 |
| 4,038,567 A | * | 7/1977 | Lewis et al. | .................... 326/86 |
| 4,074,237 A | * | 2/1978 | Spampinato | ........... 365/189.06 |

FOREIGN PATENT DOCUMENTS

| | | | |
|---|---|---|---|
| JP | 55156427 A | * | 12/1980 |
| JP | 11-191731 A | | 7/1999 |
| JP | 11-515143 A | | 12/1999 |
| JP | 2002-215118 A | | 7/2002 |
| JP | 2002-328643 A | | 11/2002 |
| JP | 3422921 B2 | | 4/2003 |
| JP | 2004-296741 A | | 10/2004 |

OTHER PUBLICATIONS

Mohamed I. Elmasry, "Digital Mos Integrated Circuits," The Institute of Electrical and Electronics Engineers, Inc., New York, 1981, p. 48.
William J. Dally et al., "Digital Systems Engineering - Fundamentals", Mar. 30, 2003, pp. 233-235, Maruzen Co., Ltd., Japan.

* cited by examiner

*Primary Examiner*—Daniel D Chang
(74) *Attorney, Agent, or Firm*—Sughrue Mion, PLLC

(57) ABSTRACT

A bootstrap circuit includes an output transistor, a bootstrap capacitor provided between the gate and source of the output transistor, a power source, and a circuit that performs ON/OFF control of a supply from the power source to the gate electrode of the transistor. An initial voltage before a bootstrap effect can be set to the potential of the power source, which is independent of the threshold voltage of the transistor. Therefore, the source output of the transistor rising or dropping due to the bootstrap effect is not affected by variations that depend on the threshold voltage of the transistor.

29 Claims, 15 Drawing Sheets

FIG. 8

FREQUENCY OF PMOS TRANSISTOR THERESHOLD VOLTAGES

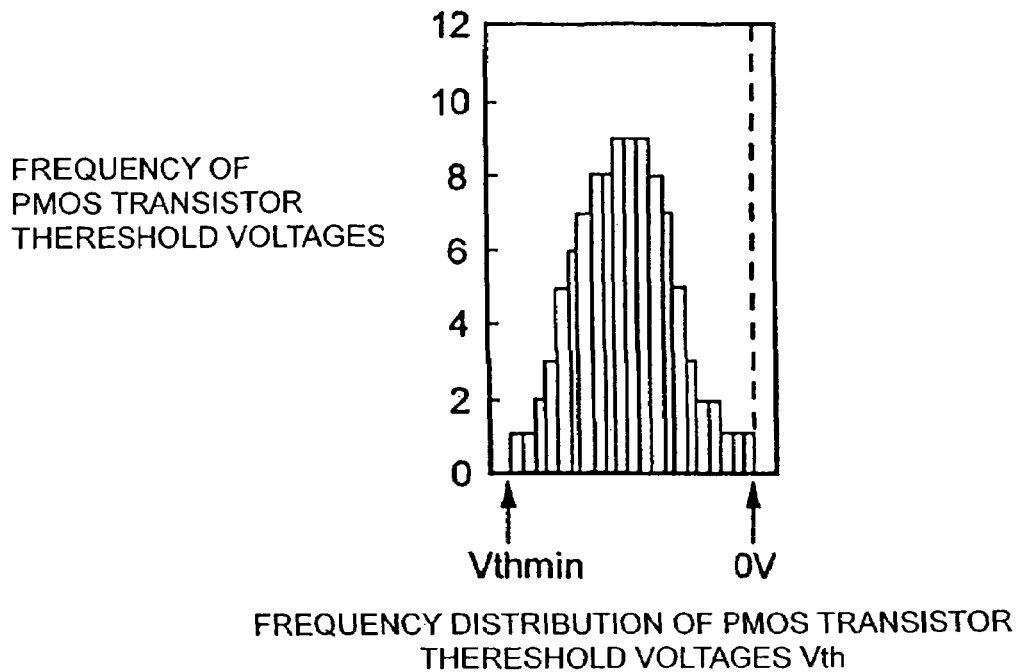

FREQUENCY DISTRIBUTION OF PMOS TRANSISTOR THERESHOLD VOLTAGES Vth

FIG. 9

RELATIONSHIP BETWEEN POWER SOURCE POTENTIAL VM AND NODE-N1 POTENTIAL (IN THE CASE OF PMOS TRANSISTOR)

| RANGE OF VM | INITIAL POTENTIAL OF NODE N1 PERIOD (A) | MINIMUM POTENTIAL OF NODE N1 PERIOD (B) |
|---|---|---|
| (1) VM=VL(CONVENTIONAL) | VL~VL-Vthmin | 2VL-VH |
| (2) VL<VM≦VL-Vthmin | VM~VL-Vthmin | VL+VM-VH |
| (3) VL-Vthmin<VM | VM | VL+VM-VH |

FREQUENCY DISTRIBUTION OF NODE-N1 POTENTIALS
(IN THE CASE WHERE VM=VL)

FREQUENCY DISTRIBUTION OF NODE-N1 POTENTIALS
(IN THE CASE WHERE VL<VM≦VL-Vthmin)

FREQUENCY DISTRIBUTION OF NODE-N1 POTENTIALS
(IN THE CASE WHERE VL-Vthmin<VM)

FIG. 13

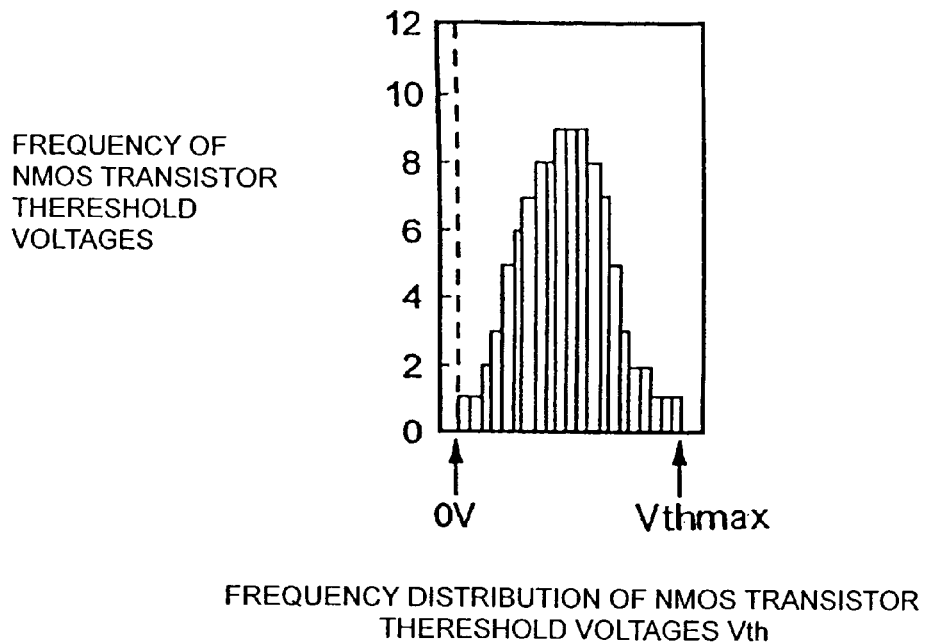

FREQUENCY DISTRIBUTION OF NMOS TRANSISTOR
THERESHOLD VOLTAGES Vth

FIG. 14

| RANGE OF VM | INITIAL POTENTIAL OF NODE N1 PERIOD (A) | MINIMUM POTENTIAL OF NODE N1 PERIOD (B) |
|---|---|---|
| (1) VM=VL(CONVENTIONAL) | VH−Vthmax∼VH | 2VH−VL |
| (2) VH−Vthmax≦VM<VH | VH−Vthmax∼VM | VH+VM−VL |
| (3) VM<VH−Vthmax | VM | VH+VM−VL |

RELATIONSHIP BETWEEN POWER SOURCE POTENTIAL VM AND
NODE-N1 POTENTIAL (IN THE CASE OF NMOS TRANSISTOR)

FREQUENCY DISTRIBUTION OF NODE-N1 POTENTIALS
(IN THE CASE WHERE VM=VL)

FREQUENCY DISTRIBUTION OF NODE-N1 POTENTIALS
(IN THE CASE WHERE VH-Vthmax≦VM<VH)

FREQUENCY DISTRIBUTION OF NODE-N1 POTENTIALS
(IN THE CASE WHERE VM<VH-Vthmax)

BOOTSTRAP CIRCUIT AND DRIVING METHOD THEREOF

BACKGROUND OF THE INVENTION

1. Field of the Invention

The present invention relates to a bootstrap circuit and a method for driving the bootstrap circuit, and also to a shift register circuit, a logical operation circuit, and a semiconductor device each using the bootstrap circuit. More particularly, the present invention relates to a semiconductor device including a circuit that outputs digital pulses, such as a shift register for driving a display device, a camera and the like and an address decoder for driving a memory device.

2. Description of the Related Art

For a circuit constituting a semiconductor device, in many cases, a CMOS (Complementary Metal-Oxide Semiconductor) circuit using an N-channel MOS (NMOS) transistor and a P-channel MOS (PMOS) transistor is generally employed because of its low power consumption. In a CMOS circuit, when digital pulses are outputted, high and low levels of potential can be outputted by using high potential (VH) and low potential (VL) as power source. In other words, the CMOS circuit can be configured such that the PMOS transistor is made conducting to output the high potential and that the NMOS transistor is made conducting to output the low potential. However, the manufacture of a CMOS semiconductor device requires multiple processes of impurity implantation to form PMOS and NMOS, in addition to other processes such as film formation, mask exposure, and etching. Accordingly, there arises a problem of an increase in cost.

On the other hand, in the case of a semiconductor device composed of MOS transistors of a single conductivity type (P-type or N-type) only, it is possible to reduce the number of processes for impurity implantation and the like in its manufacturing processes, and therefore the manufacturing costs can be reduced. However, because of a single conductivity type of semiconductor, there arise problems that the power consumption increases and the output margin decreases as compared with the CMOS transistor. More specifically, in the case of a circuit composed of PMOS transistors only, when a low potential is outputted, its output voltage becomes higher than the low potential by a potential corresponding to the threshold voltage of the transistor. In the case of a circuit composed of NMOS transistors only, when a high potential is outputted, its output voltage becomes lower than the high potential by a potential corresponding to the threshold voltage of the transistor.

In order to solve the above-mentioned problems, dynamic circuits using bootstrap effect have been proposed and utilized. An example of a general bootstrap circuit is shown in FIG. 1A, which is described in Mohamed I. Elmasry, "Digital MOS Integrated Circuits," IEEE PRESS, 1981, p. 48. This circuit includes a PMOS transistor 101 that outputs pulses from its source, a PMOS transistor 102 connecting the gate electrode of the transistor 101 and a power source that outputs a low potential VL, and a coupling capacitor 103 connected between the source and gate electrodes of the transistor 101.

A pulse signal S1 to be inputted to the drain electrode of the transistor 101 and a pulse signal S2 to be inputted to the gate electrode of the transistor 102 have two potential levels, low VL and high VH.

An operation of the above circuit will be described hereinafter. As shown in the timing chart of FIG. 1B, first, in a period A, when the pulse signal S2 becomes at the low potential VL, the potential of a node N1 decreases to a potential VL' that is higher than VL by a potential corresponding to a threshold voltage Vth of the transistor 102.

Here, a threshold voltage is defined as a voltage between the gate and source electrodes of a transistor when current flowing between the source and drain electrodes of the transistor becomes 10 nanoamperes. In the case of a PMOS transistor, it is assumed that the transistor is made conducting when the gate-source voltage is smaller than the threshold voltage. Accordingly, when the pulse signal S1 is at the high potential VH, the transistor 101 is brought into conduction, and the potential of an output OUT, which is the source of the transistor 101, becomes high (VH). The coupling capacitor 103 is charged with a voltage of (VH−VL').

Next, in a period B, when the pulse signal S2 rises to the high potential VH, the transistor 102 is brought out of conduction, and the node N1 is brought into a floating state. When the potential of the pulse signal S1 falls from VH to VL, the potential of the output OUT also decreases from VH to VL because the transistor 101 is in the conductive state. At this time, since the output OUT and the node N1 are coupled by the capacitor 103, the potential of the node N1 shifts toward lower potential. Since the potential of the node N1 drops below the low potential VL, it is possible to output the low potential VL from the output OUT, with the transistor 101 kept in the conductive state. If the charges stored in the coupling capacitor 103 are not redistributed to any other capacitor, then the potential of the node N1 drops down to (VL+VL'−VH).

A conventional circuit as shown in FIG. 1C has also been used as a circuit that produces a similar bootstrap effect. This circuit differs from the circuit of FIG. 1A in that the transistor 102 is diode-connected. Although the bootstrap circuit includes only PMOS transistors in this example, it is also possible to similarly construct a bootstrap circuit by using only NMOS transistors. An example of such a circuit is shown in FIG. 1D. This bootstrap circuit includes an NMOS transistor 104 that outputs pulses from its source, an NMOS transistor 105 connecting the gate electrode of the transistor 104 and a power source that outputs a high potential VH, and a coupling capacitor 106 provided between the source and gate electrodes of the transistor 104.

A pulse signal S1 to be inputted to the drain electrode of the transistor 104 and a pulse signal S2 to be inputted to the gate electrode of the transistor 105 have two potential levels, low VL and high VH. An operation of this circuit will be described hereinafter.

As shown in the timing chart of FIG. 1E, first, in a period A, when the pulse signal S2 becomes at the high potential VH, the potential of a node N1 increases to a potential VH' that is lower than VH by a potential corresponding to a threshold voltage Vth of the transistor 105.

Here, in the case of an NMOS transistor, it is assumed that the transistor is made conducting when the gate-source voltage is greater than the threshold voltage. At this time, when the pulse signal S1 is at the low potential VL, the transistor 104 is brought into a conductive state, and the potential of an output OUT, which is the source of the transistor 104, becomes VL. The coupling capacitor 106 is charged with a voltage of (VH'−VL).

Next, in a period B, when the pulse signal S2 falls to the low potential VL, the transistor 105 is brought out of a conductive state, and the node N1 is brought into a floating state. When the potential of the pulse signal S1 rises from VL to VH, the potential of the output OUT also increases from VL to VH because the transistor 104 is in the conductive state. At this time, since the output OUT and the node N1 are coupled by the capacitor 106, the potential of the node N1 shifts toward higher potential. Since the potential of the node N1 rises above the high potential VH, it is possible to output the high potential VH from the output OUT, with the transistor 104 kept in the conductive state. If the charges stored in the coupling capacitor 106 are not redistributed to any other capacitor, the potential of the node N1 rises up to (VH+VH'−VL).

In the bootstrap circuit composed of PMOS transistors shown in FIG. 1A, the potential of the node N1, when dropping below the low potential VL due to the bootstrap effect, depends on the initial potential VL' before the bootstrap effect occurs. When the potential VL is applied to each of the gate and drain electrodes of the transistor 102, the potential of the node N1, which is the source electrode of the transistor 102, stabilizes at VL'=VL−Vth. Here, Vth is the threshold voltage of the transistor 102. In other words, the initial potential VL' depends on the threshold voltage of the transistor, and therefore a potential drop due to the bootstrap effect also varies with the characteristics of the transistor.

A similar phenomenon also occurs in the case of NMOS transistors, which is described in detail in Japanese Patent No. 3422921. According to the specification of this patent, when the potential VH is applied to the drain electrode of the transistor 105 in FIG. 1D, the potential of the source electrode stabilizes at a potential lower than the potential VH by the threshold voltage Vth of the transistor 105.

In conventional bootstrap circuits, if there are variations in the threshold voltages of transistors, variations in the initial potential VL' are caused, leading to variations in bootstrap-dropped voltage in the same range. For example, it is assumed that manufactured transistors have variations in threshold voltage, ranging from a maximum threshold voltage Vthmax to a minimum threshold voltage Vthmin. The initial potential VL', which is the potential of the node N1 during the period A in FIG. 1B, is (VL−Vthmin) at the maximum and (VL−Vthmax) at the minimum, varying in a range equivalent to that of the variations in threshold voltage. Therefore, the potential of the node N1 that drops in the period B is (2VL−Vthmin−VH) at the maximum and (2VL−Vthmax−VH) at the minimum.

When the potential of the node N1 drops to (2VL−Vthmax−VH) in the period B, the largest voltage difference that could be produced during the operation of the bootstrap circuit increases up to (2VH+Vthmax−2VL), which is the difference between the maximum voltage VH and the minimum voltage. That is, in the case where Vthmax is large and hence variations in threshold voltage are wide, the demand for the withstand voltage performance of the transistors is increased.

On the other hand, when the potential of the node N1 drops to (2VL−Vthmin−VH) in the period B, the voltage difference between the gate and source electrodes of the transistor 101 in the conductive state becomes small. That is, in the case where Vthmin is small and hence variations in threshold voltage are wide, there is a possibility that the conduction characteristic may become insufficient. The same problem also arises in the case of NMOS transistors.

A shift register with a bootstrap circuit as described above being applied to an output section is described in Japanese Patent Application Unexamined Publication No. 2002-215118. As described therein, in the case of applying the shift register to a scanning line drive circuit of a display device, the drive circuit is composed of a shift register including several hundreds of stages corresponding to the resolution of a screen. Therefore, if the transistors constituting the first stage to the final stage of the shift register vary in threshold voltage, the demand regarding the transistor withstand voltage is increased, and the differences in the conduction characteristic may cause deterioration in a display image.

Additionally, if pixel transistors and the scanning line drive circuit are formed of single-conductivity-type thin film transistors simultaneously on a substrate of the display device by using a thin film transistor (TFT) technique, advantages are obtained such as a reduction in the manufacturing costs and the improved reliability of scanning wiring connections. However, higher withstand voltage properties are demanded of the transistors. This is because thin film transistors generally have high threshold voltages and have wide manufacturing variations in threshold voltage, as compared with transistors manufactured by a single-crystal semiconductor technique.

Accordingly, a phenomenon to be avoided is that a bootstrap effect causes a change in potential. In other words, a problem to be solved is that variations occur in the potential that drops or rises due to the bootstrap effect. When a potential change is large, a high voltage is applied between the electrodes of the transistor, causing deterioration. When a potential change is small, the transistor is brought into insufficient conduction, which may cause a trouble in the operation of the circuit, resulting in degraded reliability of a semiconductor device.

The reason why such a problem occurs is that an initial voltage applied to the gate electrode of a transistor before a bootstrap effect occurs depends on the threshold voltage of another transistor that provides the initial voltage. Accordingly, variations also occur in the potential that varies in the same range as that of manufacturing variations in transistor threshold voltage.

SUMMARY OF THE INVENTION

An object of the present invention is to provide a bootstrap circuit with high reliability by reducing the range of variations in the potential that changes due to the bootstrap effect, a method for driving the bootstrap circuit, a shift register circuit, a logical operation circuit, and a semiconductor device.

According to an aspect of the present invention, a bootstrap circuit includes an output transistor having first and second main electrodes and a gate electrode, wherein the bootstrap circuit provides bootstrapping of an output on the first main electrode of the output transistor by use of capacitance existing between the first main electrode and the gate electrode of the output transistor, the bootstrap circuit further includes: a first power source for supplying a first potential to the gate electrode of the output transistor; and a first circuit for controlling supply of the first potential to the gate electrode of the output transistor.

The first potential may be set to a potential that, when supplied to the gate electrode by the first circuit, is sufficient to bring the output transistor into conduction with respect to a potential of the first main electrode. The first circuit preferably controls such that the supply of the first potential to the gate electrode is provided during a first period and is cut off during a second period following the first period.

Preferably the bootstrap circuit further includes: a second power source for supplying a second potential to the gate electrode of the output transistor; and a second circuit for controlling supply of the second potential to the gate electrode of the output transistor. The second potential may be set to a potential that, when supplied to the gate electrode by the second circuit, is sufficient to bring the output transistor out of conduction with respect to a potential of the first main electrode.

Preferably the first circuit controls such that the supply of the first potential to the gate electrode is provided during a first period and is cut off during a second period following the first period, and the second circuit controls such that the supply of the second potential to the gate electrode is provided during a third period that does not overlap with the first and second periods, and is cut off during a fourth period following the third period.

According to another aspect of the present invention, a bootstrap circuit is driven, which includes: an output transistor having first and second main electrodes and a gate electrode, wherein the bootstrap circuit provides bootstrapping of an output on the first main electrode of the output transistor by use of capacitance existing between the first main electrode and the gate electrode of the output transistor; a first power source for supplying a first potential to the gate electrode of the output transistor; and a first circuit for controlling supply of the first potential to the gate-electrode of the output transistor During a first period, the first potential to the gate electrode is supplied by control of the first circuit. During a second period following the first period, the supply of the potential is cut off by control of the first circuit.

The first potential may be set to a potential that, when supplied to the gate electrode by the first circuit, is sufficient to bring the output transistor into conduction with respect to a potential of the first main electrode.

Preferably, the bootstrap circuit further includes: a second power source for supplying a second potential to the gate electrode of the output transistor; and a second circuit for controlling supply of the second potential to the gate electrode of the output transistor. The supply of the second potential to the gate electrode is provided during a third period that does not overlap with the first and second periods. The supply of the second potential to the gate electrode is cut off during a fourth period following the third period.

A shift register circuit and a logical operation circuit according to the present invention are each characterized by employing any of the above-mentioned bootstrap circuits for an output section. In addition, a semiconductor integrated circuit according to the present invention is characterized by employing the shift register circuit as a scanning line drive circuit.

According the present invention, a voltage that changes due to the bootstrap effect can be determined independently of the threshold voltage of a transistor, and therefore the influence of manufacturing variations in transistors can be reduced. Accordingly, a circuit with a small range of manufacturing variations and high reliability can be provided.

Further, according to the present invention, the amount of change in the voltage due to the bootstrap effect can be made small. Accordingly, the voltage to be applied to a transistor can be reduced, resulting in a circuit with high reliability.

Furthermore, according to the present invention, a power source used in the semiconductor matrix device can be also used for a power source required to reduce the influence of manufacturing variations in transistors, resulting in the reduced number of power sources. Accordingly, the semiconductor matrix device can suppress an increase in cost and further can reduce a range of manufacturing variations, thereby obtaining high reliability.

BRIEF DESCRIPTION OF THE DRAWINGS

FIG. 8 is a histogram showing the frequency distribution of PMOS transistor threshold voltages Vth.

FIG. 9 is a table showing relationships between the potential VM of a power source and the potential of a node N1 (in the case of the PMOS transistors).

FIG. 13 is a histogram showing the frequency distribution of NMOS transistor threshold voltages Vth.

FIG. 14 is a table showing relationships between the potential VM of a power source and the potential of a node N1 (in the case of the NMOS transistors).

DETAILED DESCRIPTION OF THE PREFERRED EMBODIMENTS

Preferred embodiments of the present invention will be described in detail with reference to the accompanying drawings.

1. First Embodiment

Figure 2:
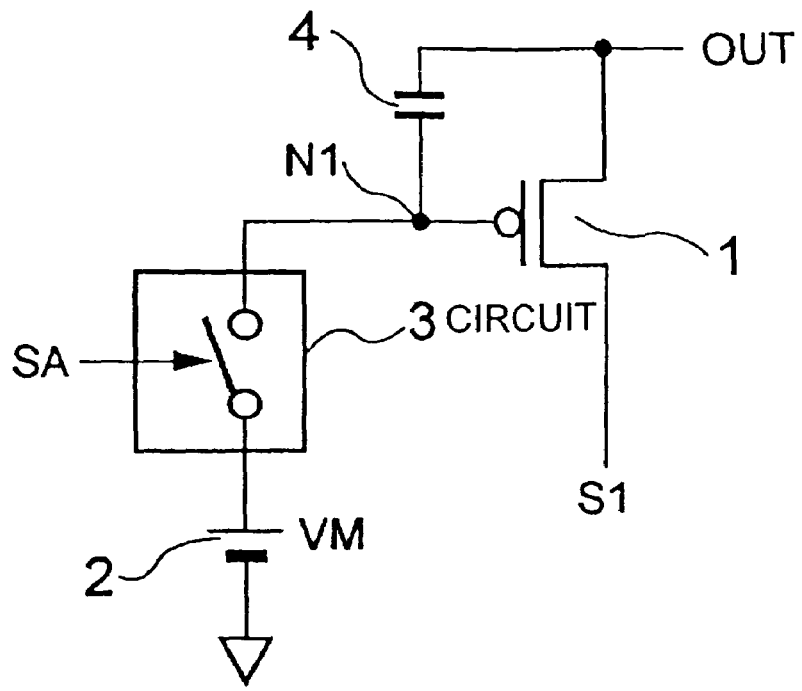
FIG. 2 is a diagram showing a bootstrap circuit according to a first embodiment of the present invention.

Referring to FIG. 2, a bootstrap circuit according to a first embodiment of the present invention includes a P-channel MOS (PMOS) transistor 1 that outputs pulses, a coupling capacitor 4 connected between the source electrode (output OUT) and gate electrode (node N1) of the transistor 1, a power source 2 that outputs a DC voltage VM, and a circuit 3 for controllably applying the potential VM to the gate electrode of the transistor 1.

A pulse signal S1 to be inputted to the drain electrode of the transistor 1 is a pulse signal of a high potential VH and a low potential VL. The circuit 3 has a function of connecting the power source 2 to the node N1 of the transistor 1 to apply the potential VM when a pulse signal SA is at a high level, and a function of disconnecting the power source 2 from the node N1 when SA is at a low level. Here, as a characteristic of the PMOS transistor 1, it is assumed that the transistor 1 is brought into a conductive state when the potential difference between the gate and source electrodes is equal to or smaller than (VM−VH), where relation in magnitude between VM and VH is not specified. As for the coupling capacitor 4, for example, it may be formed only of coupling capacitance between the source and gate of the transistor 1. In addition to this, parasitic capacitance between interconnects may be used, or other separate capacitance may be added by designing so that such capacitance is formed.

Figure 3:
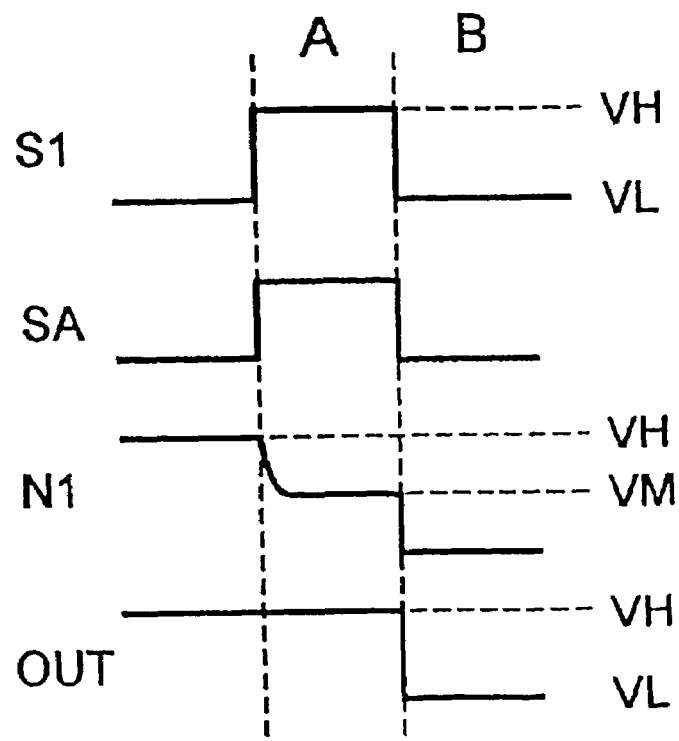
FIG. 3 is a timing chart showing an operation of the bootstrap circuit of FIG. 2.

As shown in FIG. 3, the bootstrap circuit is driven. First, during a period A, since the pulse signal SA is at the high level, the initial potential of the node N1 is charged to VM. In the period A, during which the pulse signal S1 is at the high potential VH, since the gate potential of the transistor 1 is VM, the condition for the conduction of the transistor 1 is satisfied. Further, the coupling capacitor 4 is charged with a voltage that is the difference between the high-potential output voltage and the potential VM of the node N1, and unless a voltage drop occurs between the source and drain electrodes of the transistor 1, that potential difference is (VH−VM). During a period B, since SA becomes at the low level, the power source 2 and the node N1 are disconnected, and the node N1 is brought into a floating state.

When S1 falls to the low potential VL, the bootstrap effect of the transistor 1 being in the conductive state causes the potential of the output OUT to be lowered to VL and the potential of the node N1 to drop below VM because of the voltage of the coupling capacitor 4. In an ideal state in which the charges stored in the coupling capacitor 4 are not distributed to any other capacitance, the potential of the node N1 drops down to (VL−VH+VM). Accordingly, even in the period during which S1 is at the low potential VL, the transistor 1 can be kept in the conductive state.

Here, a feature of the present invention is that the potential of the node N1 dropping due to the bootstrap effect is determined depending on the potentials of respective power sources. As described above, for the circuit to function as a bootstrap circuit, it is necessary that the transistor 1 is brought into the conductive state in the following conditions: the potential VM is applied to the node N1; the drain potential of the transistor 1 is the high potential VH; and the output level of the circuit is high. In other words, it is possible to selectively disable the function of the bootstrap circuit, depending on the potential to be applied to the node N1.

2. Second Embodiment

Figure 4:
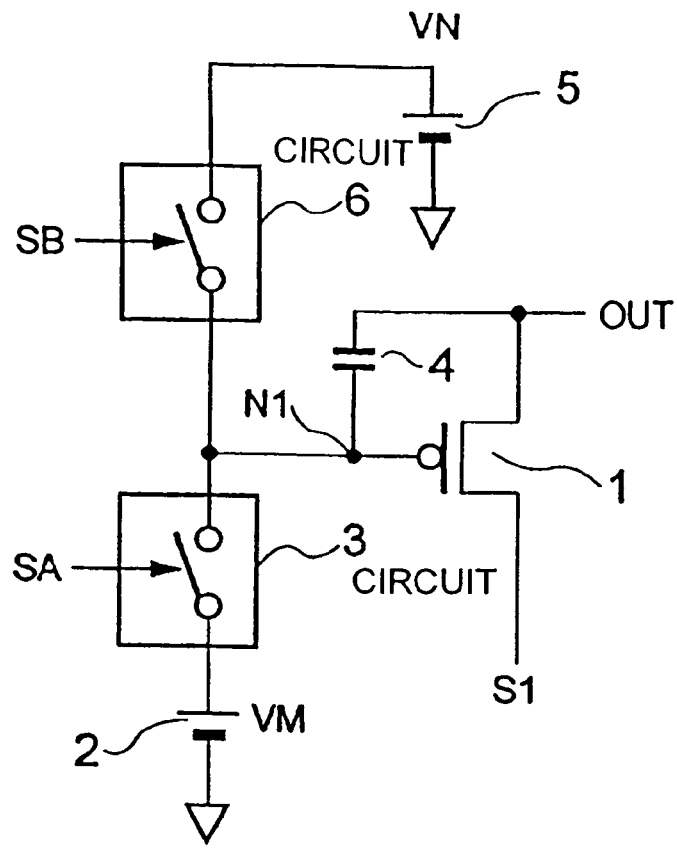
FIG. 4 is a diagram showing a bootstrap circuit according to a second embodiment of the present invention.

Referring to FIG. 4, a bootstrap circuit according to a second embodiment of the present invention includes a PMOS transistor 1 that outputs pulses, a coupling capacitor 4 provided between the source electrode (output OUT) and gate electrode (node N1) of the transistor 1, a power source 2 that outputs a voltage of VM, a circuit 3 for controllably applying the potential VM to the node N1, a power source 5 that outputs a voltage of VN, and a circuit 6 for controllably applying the potential VN to the node N1.

A pulse signal S1 to be inputted to the drain electrode of the transistor 1 is a pulse signal of a high potential VH and a low potential VL. The circuit 3 has a function of connecting the power source 2 to the node N1 to apply the potential VM to the node N1 when a pulse signal SA is at a high level, and a function of disconnecting the power source 2 from the node N1 when SA is at a low level. The circuit 6 has a function of connecting the power source 5 to the node N1 to apply the potential VN to the node N1 when a pulse signal SB is at a high level, and a function of disconnecting the power source 5 from the node N1 when SB is at a low level.

Here, it is assumed that the relation in magnitude between the voltage VM of the power source 2 and the voltage VN of the power source 5 is (VM<VN). Further, as a characteristic of the transistor 1, it is assumed that the transistor 1 is in a conductive state when the potential difference between the gate and source electrodes is (VM−VH) and in a non-conductive state when the potential difference between the gate and source electrodes is (VN−VH), where relations in magnitude of VM and VN with VH are not specified.

Figure 5:
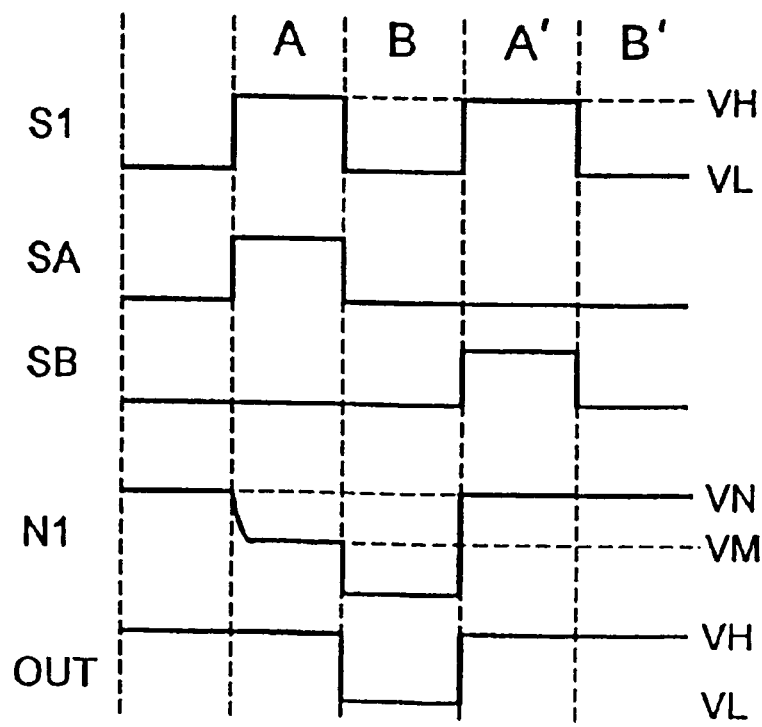
FIG. 5 is a timing chart showing an operation of the bootstrap circuit of FIG. 4.

Referring to FIG. 5, the above bootstrap circuit is driven. First, during a period A, SA is at the high level, and SB is at the low level. Therefore, the node N1 is connected only to the power source 2, and the initial potential of the node N1 is charged to VM. In the period A, during which the pulse signal S1 is at the high potential VH, since the gate potential of the transistor 1 is VM, the condition for the conduction of the transistor 1 is satisfied. Further, the coupling capacitor 4 is charged to a voltage that is the difference between the high-level output and the potential VM of the node N1 and is therefore (VH−VM) unless a voltage drop occurs between the source and drain electrodes of the transistor 1.

During a period B, both SA and SB are at the low level. Therefore, the connection between the node N1 and the power source 2 and the connection between the node N1 and the power source 5 are broken, bringing the node N1 into a floating state. When S1 falls to the low potential VL, the potential of the output OUT is lowered to the low potential VL due to the bootstrap effect of the transistor 1 being in the conductive state.

Next, during a period A', SA is at the low level, and SB is at the high level. Therefore, the node N1 is connected only to the power source 5, and the initial potential of the node N1 is charged to VN. In this period, S1 is at the high potential VH, but the gate potential of the transistor 1 is VN. Therefore, the transistor 1 is brought out of conduction. Thus, during a period B', even if S1 falls to the low potential VL, the bootstrap effect of the transistor 1 does not occur, and the potential of the output OUT is maintained at the high level. It should be noted that the period A' does not need to be continuous with the period B although the periods B and A' are depicted as being continuous in FIG. 5. The period A' may be provided so as not to overlap with the period A or the period B.

A feature of the second embodiment is that, in addition to the feature of the first embodiment, the occurrence of the bootstrap effect is suppressed when the initial potential to be applied to the node N1 is the potential VN that does not bring the transistor into conduction.

In the case where the potential VM of the power source 2 is not lower than the high potential VH (VM≧VH) in the second embodiment, the threshold voltage Vth of the PMOS transistor 1 needs to be at least higher than 0 V (Vth>0) in order that the PMOS transistor 1 be in the conductive state even when the gate potential is VM and the source potential is VH. Further, the potential VN of the power source 5 is higher than VM, resulting in VN>VH. Accordingly, at least one power source of a potential higher than the high potential VH is required. Hereinafter, with consideration given to the withstand voltage of the transistor, conditions for the maximum voltage to be limited to the high potential VH are considered.

According to the present embodiment, the power source 2 of the output potential VM and the power source 5 of the output potential VN are needed as additional power sources where, as mentioned above, VM<VN. Therefore, if the potential of the power source 5 is made equal to VH (VN=VH), the maximum potential is limited to VH, which makes it possible to reduce the additional power sources only to the power source 2. In this case, it is necessary for the potential VM to be lower than the high potential VH. In addition, when the gate potential is the high potential VH, the threshold voltage Vth of the transistor 1 is limited to a voltage smaller than 0 V, Vth<0, so as to bring the transistor 1 into the non-conductive state independently of an output from OUT (not lower than VL and not higher than VH).

3. Third Embodiment

Figure 6:
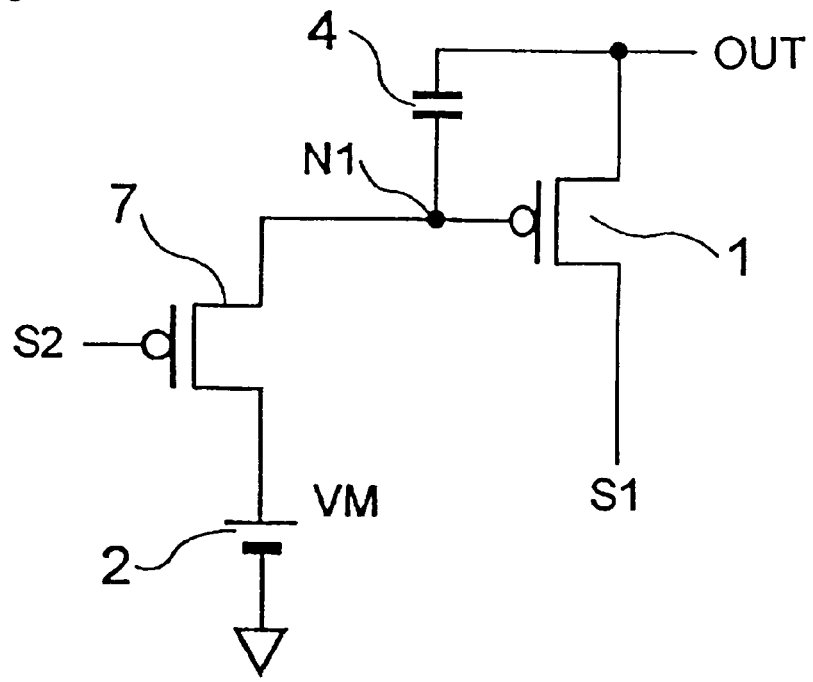
FIG. 6 is a diagram showing a bootstrap circuit according to a third embodiment of the present invention.

FIG. 6 shows a bootstrap circuit according to a third embodiment of the present invention, in which the circuit 3 in the bootstrap circuit described in the first embodiment is composed of a specific transistor. In the present embodiment, the circuit 3 is composed of a PMOS transistor 7 having the source and drain electrodes that are connected to the node N1 and the power source 2, respectively. Here, it is assumed that the PMOS transistor 7 is in a conductive state when a pulse signal S2 is at a low level VLL and in a non-conductive state when S2 is at a high level VHH.

Figure 7:
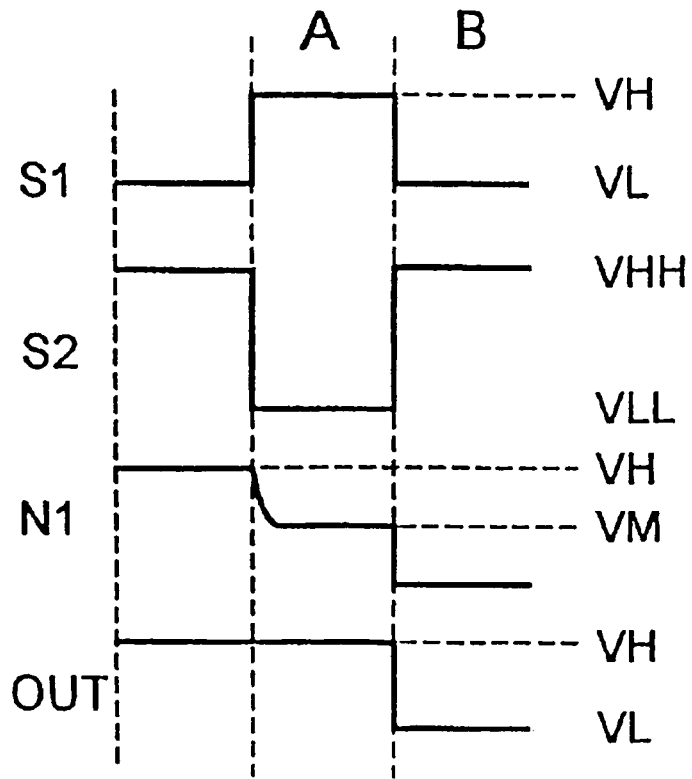
FIG. 7 is a timing chart showing an operation of the bootstrap circuit of FIG. 6.

Referring to FIG. 7, the above bootstrap circuit is driven. First, during a period A, since S2 is at the low level VLL, the PMOS transistor 7 is brought into a conductive state, and the initial potential of the node N1 is charged to VM. In the period A, during which the pulse signal S1 is at the high potential VH, since the gate potential is VM, the condition for the conduction of the transistor 1 is satisfied. Further, since the coupling capacitor 4 is charged to a voltage of VM that is the difference between the high-level output and the potential VM of the node N1 and is therefore (VH−VM) unless a voltage drop occurs between the source and drain electrodes of the transistor 1.

During a period B, raising S2 to the high level VHH brings the transistor 7 into a non-conductive state, which brings the node N1 into a floating state. At this time, if S1 falls to the low potential VL, the potential of the output OUT is lowered to VL due to the bootstrap effect of the transistor 1 being in the conduction state, and the potential of the node N1 drops below VM because of the voltage of the coupling capacitor 4. In an ideal state in which the charges stored in the coupling capacitor 4 are not distributed to any other capacitance, the potential of the node N1 drops down to (VL−VH+VM). Therefore, it is possible for the transistor 1 to maintain the conductive state even in the period during which the output OUT is at the low potential VL.

Next, the relation in magnitude between the potential VM of the power source and the low potential VL in the third embodiment will be examined. First examined is the case where VM≦VL. In the case where the threshold voltage of the PMOS transistor 7 is lower than 0 V, the transistor 7 cannot be brought into a conductive state if the low level of the pulse signal S2 is VL. However, by applying the low level VLL that is lower than VM, it is possible to bring the transistor 7 into the conductive state, allowing the initial potential of the node N1 to be set to VM.

Next, the case where the potential VM of the power source is higher than VL (i.e., VM>VL) will be examined. In this case, it is possible to select as the low level VLL of S2 the low potential VL, which is the same as the low level of S1, and it is no longer necessary to add a power source having the output potential smaller than the low potential VL.

In this connection, investigation was carried out as to changes in the initial potential of the node N1 and to changes in the minimum potential when the potential of the node N1 dropped, which depended on the potential VM of the power source 2 in the case where the distribution of threshold voltages Vth of the transistor 7 ranges between Vthmin and 0 V (i.e., Vthmin<Vth<0 V) as shown in FIG. 8. The results of the investigation are shown in FIG. 9.

Figure 1A:
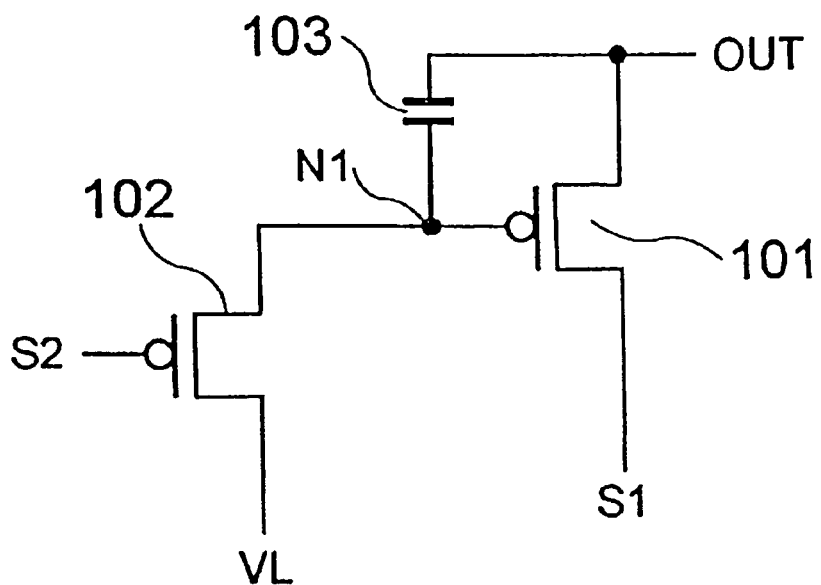
FIG. 1A is a diagram showing an example of a conventional bootstrap circuit.
Figure 1B:
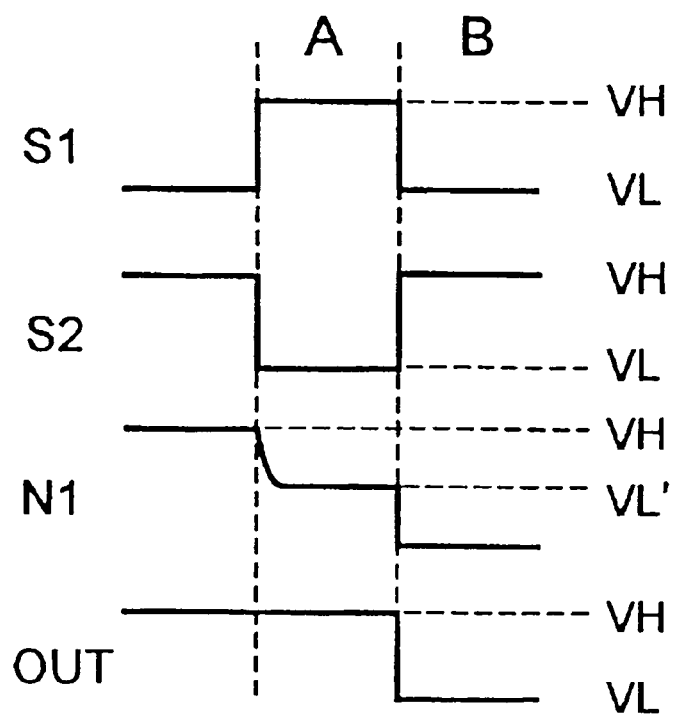
FIG. 1B is a timing chart showing the operation timing of the circuit of FIG. 1A.
Figure 1C:
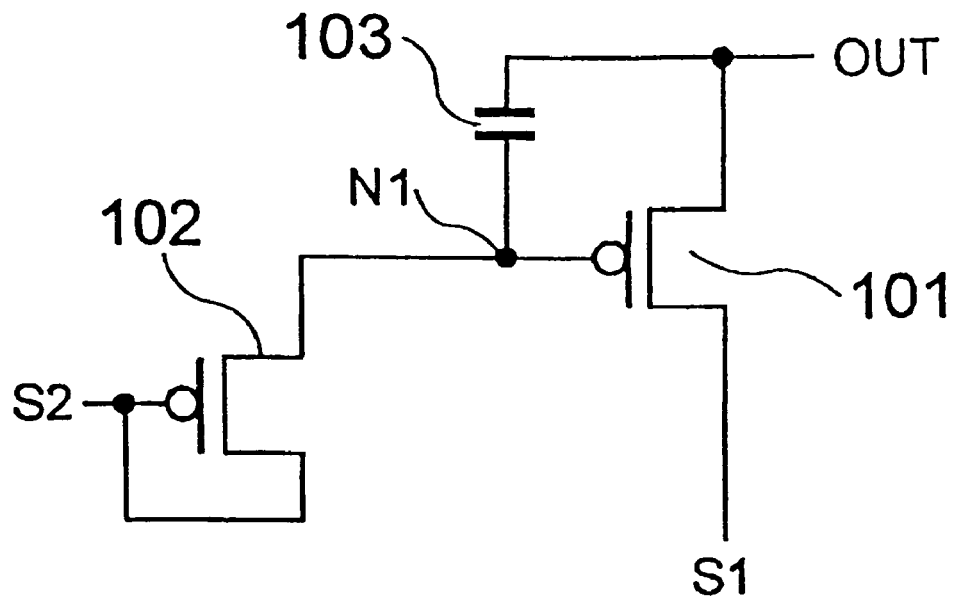
FIG. 1C is a diagram showing another example of the conventional bootstrap circuit.
Figure 10A:
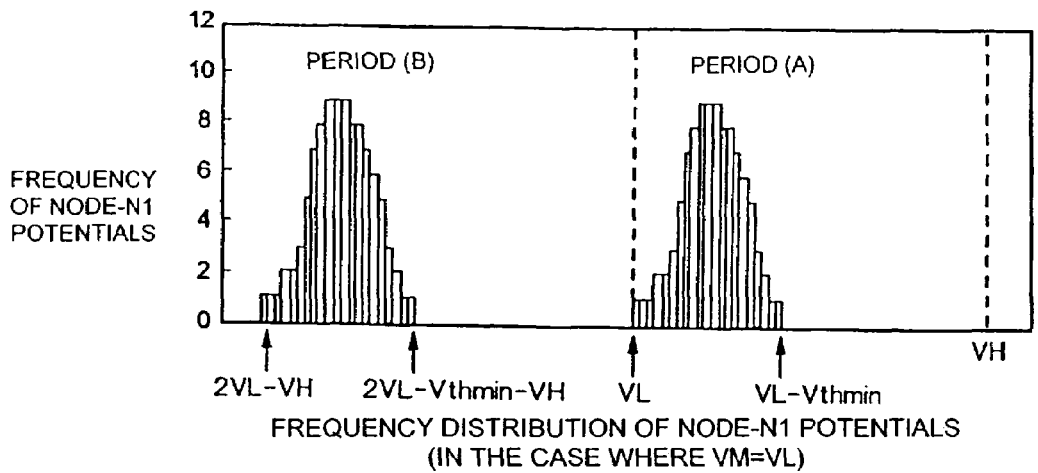
FIG. 10A is a histogram showing the frequency distribution of node-N1 potentials (in the case where VM=VL).
Figure 10B:
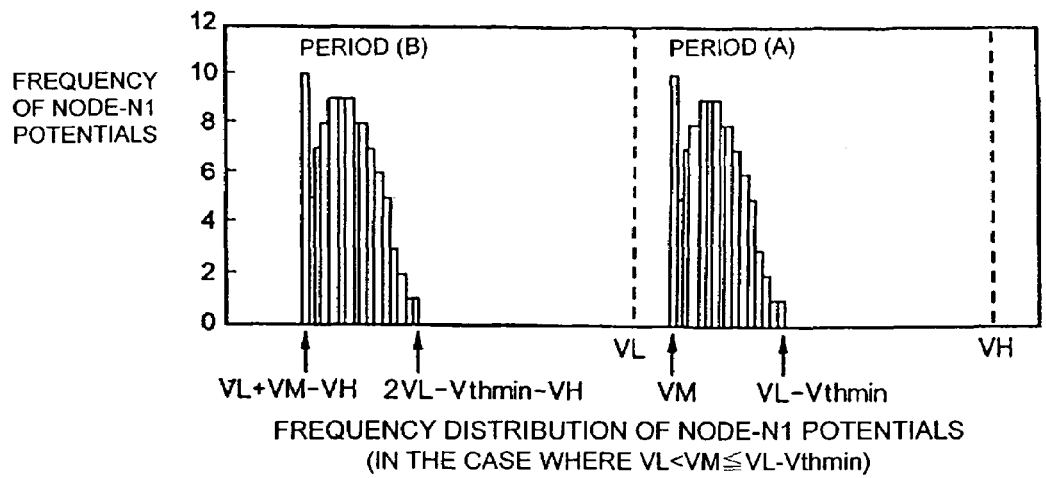
FIG. 10B is a histogram showing the frequency distribution of node-N1 potentials (in the case where VL<VM≦VL−Vthmin).

The range of the potential VM of the power source is classified into three cases: (1) VM=VL, which corresponds to the case of the conventional bootstrap circuit shown in FIG. 1A, (2) VL<VM≦VL−Vthmin, and (3) VL−Vthmin<VM. In the case (1), as shown in FIG. 10A, the initial potential of the node N1 varies in a range of VL to (VL−Vthmin), which is as wide as the range of variations in the threshold voltage. In the case (2), as shown in FIG. 10B, the initial potential of the node N1 varies in a range of VM to (VL−Vthmin), which is narrower than the range of the case (1). The reason is as follows. The node N1 is electrically connected to the power source 2 when transistors that are used as the transistor 7 have threshold voltages falling within a range of (VM−VL) to 0 V in the threshold voltage distribution of FIG. 8. Therefore, in these cases, the node N1 is not charged to a potential lower than VM, resulting in the increased frequency with which the node N1 is charged to VM.

Figure 10C:
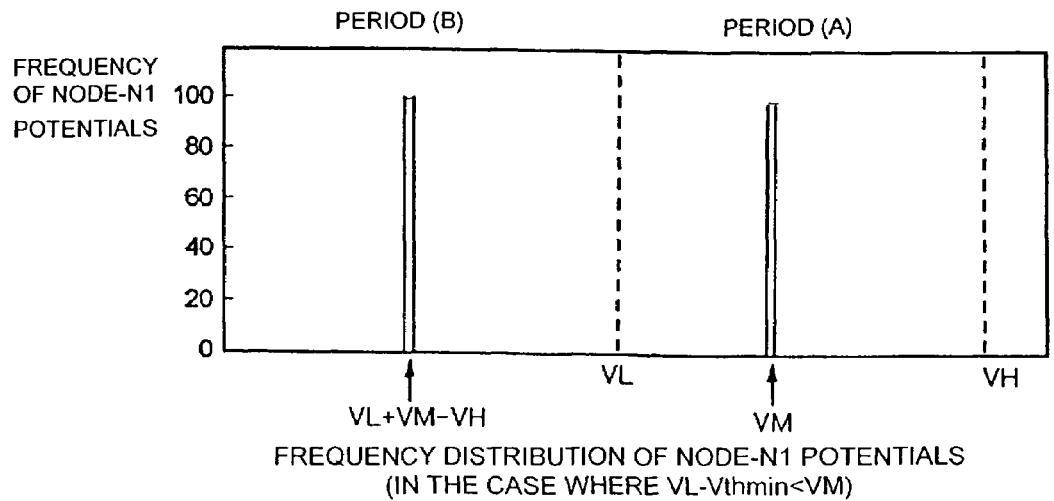
FIG. 10C is a histogram showing the frequency distribution of node-N1 potentials (in the case where VL−Vthmin<VM).

Further, in the case (3), as shown in FIG. 10C, with every transistor, the initial potential of the node N1 is charged to VM, producing no variations. As for the minimum potential of the node N1, in the case (1), it is expressed as (2VL−VH). This means that the potential of the node N1 drops to a potential that is determined depending on the high potential VH and the low potential VL of the bootstrap circuit. In contrast to this, in the cases (2) and (3), the minimum potential is expressed as (VL+VM−VH), which means that the minimum potential can be controlled by using the potential VM of the power source 2 that is independent of the output voltage of the circuit. In addition, since VL<VM, the minimum potential is higher than that of the case (1), and therefore the withstand voltage of the transistor can be reduced.

Transistors varying widely in threshold voltage, such as thin film transistors, produce a range of variations at least about 0.5 V wide. In this case, by making the potential VM of the power source 2 higher than the low potential VL by about 0.5 V, it is possible to allow the initial potential of the node N1 to be the potential VM of the power source 2, regardless of the performance of the transistor 7.

A feature of the third embodiment is that the range of variations in the initial potential to be applied to the node N1 can be made smaller than the range of variations in transistor threshold voltage. Another feature is that the minimum value of the potential of the node N1 dropping due to the bootstrap effect can be determined by using the potential VM of the power source that applies the initial potential to the node N1.

4. Fourth Embodiment

Although the PMOS transistors are used in the third embodiment, NMOS transistors can be used to form a bootstrap circuit.

Figure 11:
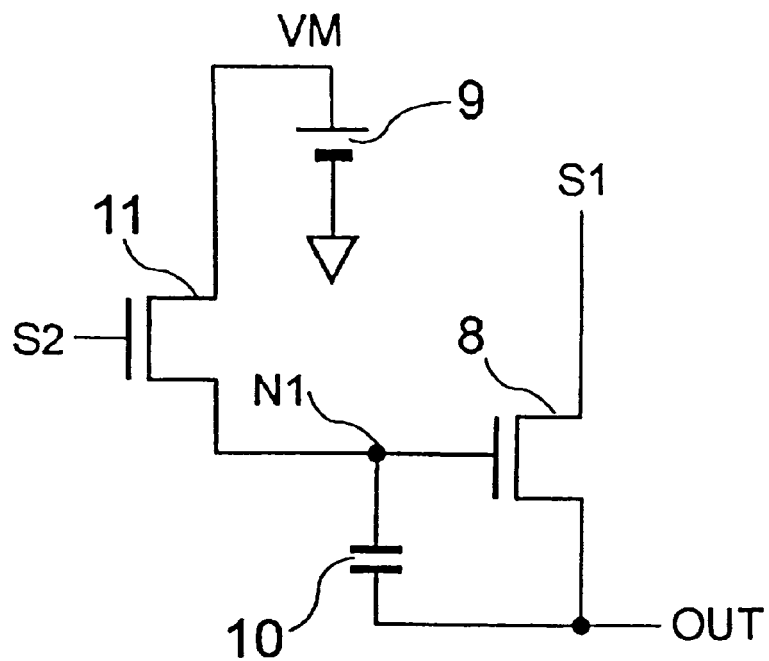
FIG. 11 is a diagram a bootstrap circuit according to a fourth embodiment of the present invention.

FIG. 11 shows a bootstrap circuit using NMOS transistors 8 and 11 as a fourth embodiment of the present invention. Here, it is assumed that the NMOS transistor 11 is brought into a conductive state when the pulse signal S2 is at the high level VHH and into a non-conductive state when S2 is at the low level VLL.

Figure 12:
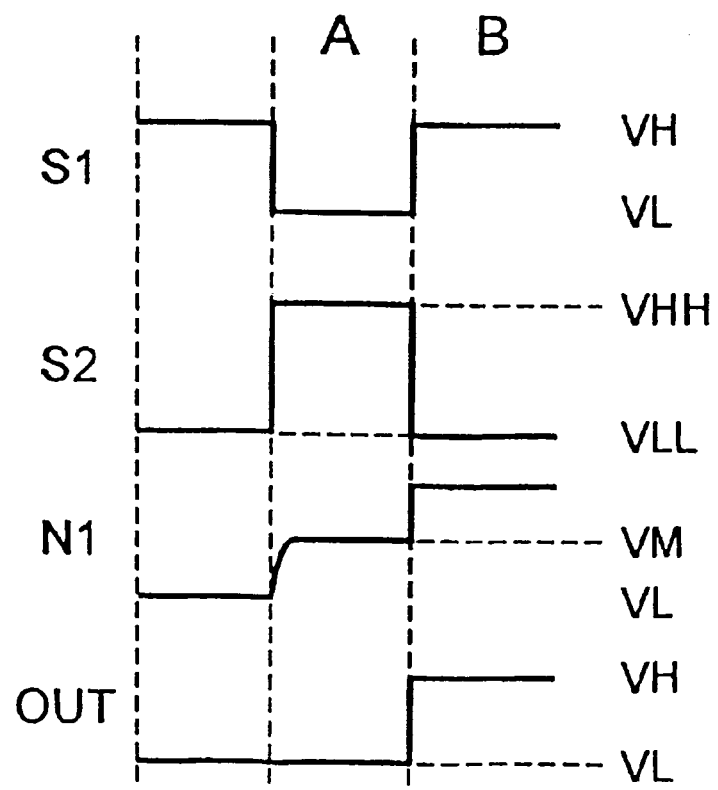
FIG. 12 is a timing chart showing an operation of the bootstrap circuit of FIG. 11.

Referring to FIG. 12, the above bootstrap circuit is driven. First, during a period A, since S2 is at the high level VHH, the NMOS transistor 11 is in a conductive state, and the initial potential of the node N1 is charged to VM. In the period A, during which the pulse signal S1 is at the low potential VL, since the gate potential is VM, the condition for the conduction of the transistor 8 is satisfied. Further, a coupling capacitor 10 is charged to a voltage that is the difference between the low-level output and the potential VM of the node N1 and is therefore (VM−VL) unless a voltage drop occurs between the source and drain electrodes of the transistor 8.

During a period B, lowering S2 to the low level VLL brings the transistor 11 into a non-conductive state, which brings the node N1 into a floating state. When S1 rises to the high potential VH, the potential of the output OUT is raised to VH due to the bootstrap effect of the transistor 8 being in the conductive state, and the potential of the node N1 rises above VM because of the voltage of the coupling capacitor 10. In an ideal state in which the charges stored in the coupling capacitor 10 are not distributed to any other capacitance, the potential of the node N1 rises up to (VH−VL+VM). Therefore, it is possible for the transistor 8 to maintain the conductive state even in the period during which the pulse signal S1 is at the high potential VH.

Next, the relation in magnitude between the potential VM of a power source 9 and the high potential VH in the fourth embodiment will be examined. First examined is the case where VM≧VH. Assuming that the threshold voltage of the NMOS transistor 11 is higher than 0 V, if the high level of the pulse signal S2 is HV, then the transistor 11 cannot be brought into a conductive state. However, by applying the high level VHH that is higher than VM, it is possible to allow the initial potential of the node N1 to be set to VM.

Next, the case where the potential VM of the power source 9 is lower than VH (i.e., VM<VH) will be examined. In this case, it is possible to select as the high level VHH of S2 the high potential VH, which is the same as the high level of S1, and it is no longer necessary to add a power source having the output potential higher than the high potential VH.

In this connection, investigation was carried out as to changes in the initial potential of the node N1 and to changes in the maximum potential when the potential of the node N1 rose, which depended on the potential level of the power source 9, in the case where the distribution of the threshold voltages Vth of the transistor 11 ranges between 0 V and Vthmax (i.e., 0 V<Vth<Vthmax) as shown in FIG. 13. The results of the investigation are shown in FIG. 14.

Figure 1D:
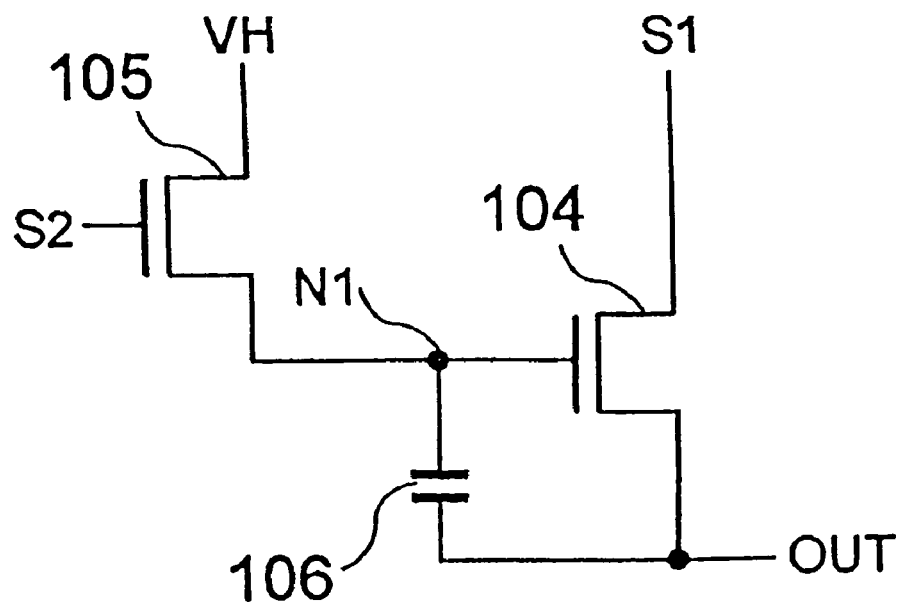
FIG. 1D is a diagram showing still another example of the conventional bootstrap circuit.
Figure 1E:
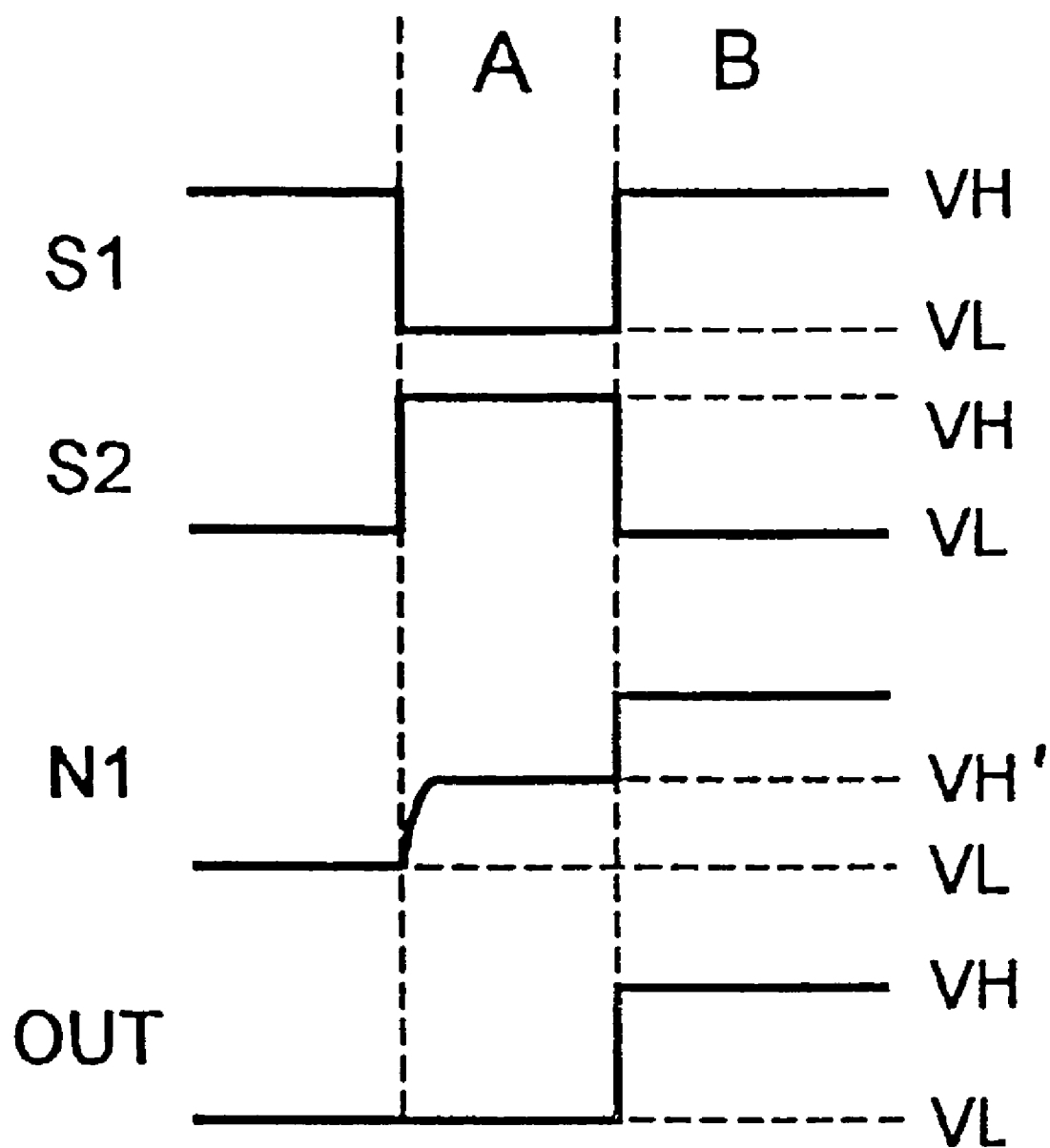
FIG. 1E is a timing chart showing the operation timing of the circuit of FIG. 1D.
Figure 15A:
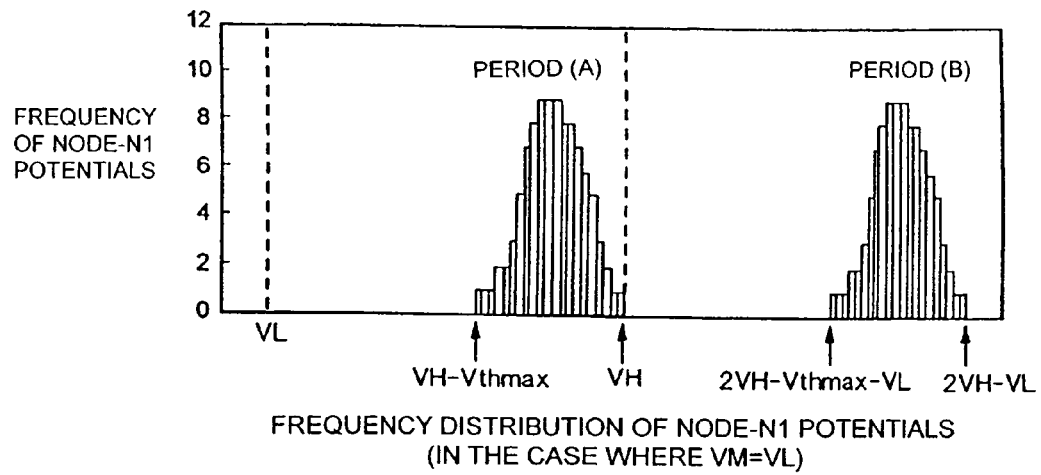
FIG. 15A is a histogram showing the frequency distribution of node-N1 potentials (in the case where VM=VH).
Figure 15B:
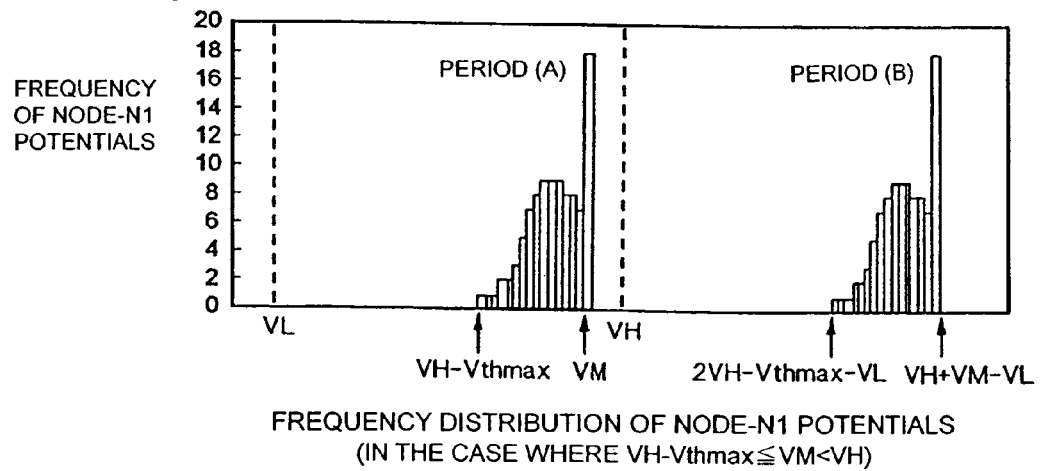
FIG. 15B is a histogram showing the frequency distribution of node-N1 potentials (in the case where VH−Vthmax≦VM≦VH).

The range of the potential VM of the power source is classified into three cases: (1) VM=VL, which corresponds to the case of the conventional bootstrap circuit shown in FIG. 1D, (2) VH−Vthmax≦VM<VH, and (3) VM<VH−Vthmax. In the case (1), as shown in FIG. 15A, the initial potential of the node N1 varies in a range of (VH−Vthmax) to VH, which is as wide as the range of variations in the threshold voltage. In the case (2), as shown in FIG. 15B, the initial potential of the node N1 varies in a range of (VH−Vthmax) to VM, which is narrower than the range of the case (1) The reason is as follows. The node N1 is electrically connected to the power source 9 when transistors that are used as the transistor 11 have threshold voltages falling within a range of 0 V to (VH−VM) in the threshold voltage distribution of FIG. 13. Therefore, the node N1 is not charged to a potential higher than VM, resulting in the increased frequency with which the node N1 is charged to VM.

Figure 15C:
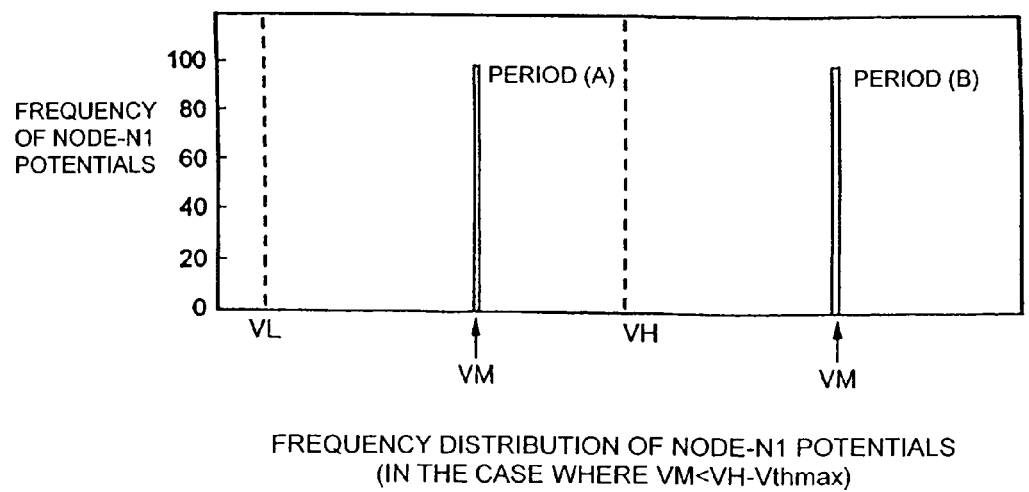
FIG. 15C is a histogram showing the frequency distribution of node-N1 potentials (in the case where VM<VH−Vthmax).

Further, in the case (3), as shown in FIG. 15C, with every transistor, the initial potential of the node N1 is charged to VM, producing no variations. As for the maximum potential of the node N1, in the case (1), it is expressed as (2VH−VL). This means that the potential of the node N1 rises to a potential that is determined depending on the high potential VH and the low potential VL of the bootstrap circuit. In contrast to this, in the cases (2) and (3), the maximum potential is expressed as (VH+VM−VL), which means that the maximum potential can be controlled by using the potential VM of the power source 9 that is independent of the output voltage of the circuit. In addition, since VM<VH, the maximum potential is lower than that of the case (1), and therefore the withstand voltage of the transistor can be reduced.

If the range of variations in NMOS-transistor threshold voltage is substantially as wide as the range of variations in PMOS-transistor threshold voltage described in the third embodiment, then it is possible to allow the initial potential of the node N1 to be the potential VM of the power source 9, regardless of the performance of the transistor 11, by making the potential VM of the power source 9 lower than the high potential VH by about 0.5 V.

A feature of the fourth embodiment is that, also in the case of the NMOS transistor, the range of variations in the initial potential to be applied to the node N1 can be made smaller than the range of variations in transistor threshold voltage. Another feature is that the maximum value of the potential of the node N1 rising due to the bootstrap effect can be determined by using the potential VM of the power source that applies the initial potential to the node N1.

5. Fifth Embodiment

As described before, a bootstrap circuit according to the present invention may be applied to a shift register circuit in which a bootstrap circuit is applied to an output section thereof, a semiconductor matrix device using a scanning line drive circuit composed of the shift register circuit, and the like. Next, as a fifth embodiment of the present invention, a display device, as an example, will be described with reference to the accompanying drawings.

Figure 16:
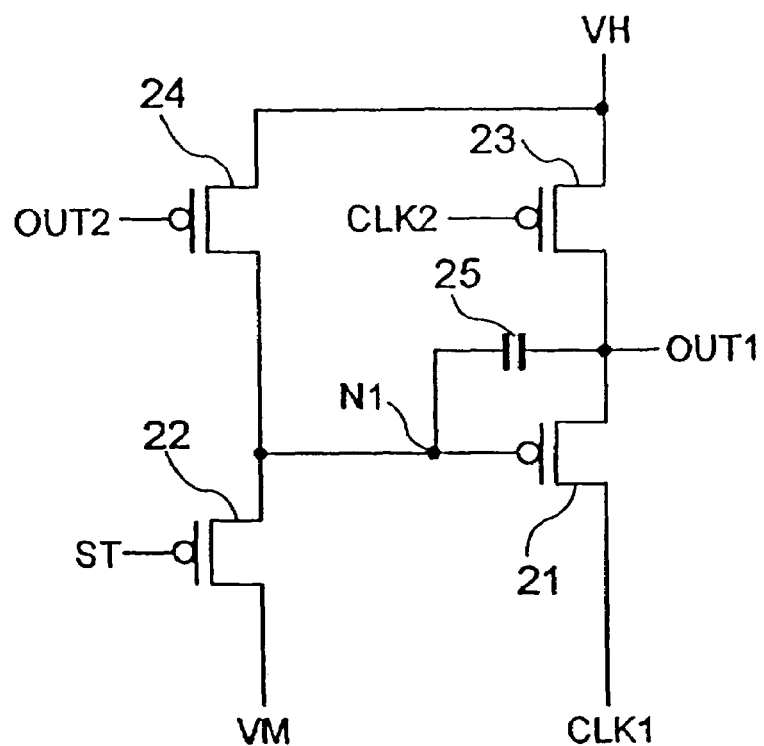
FIG. 16 is a diagram showing a stage of a shift register having a bootstrap circuit applied thereto according to the present invention.

FIG. 16 shows a single stage of the shift register circuit composed of PMOS transistors. The present circuit includes an output transistor 21 that produces a bootstrap effect, a transistor 22 for applying an initial potential to the gate electrode (node N1) of the transistor 21, a coupling capacitor 25, a transistor 23 for outputting a high potential VH, and a transistor 24 for resetting the transistor 21 to a non-conductive state.

Power sources used in the present embodiment are a power source that outputs the high potential VH and a power source that outputs an intermediate potential VM. Further, input pulse signals are start pulse ST, clock CLK1, and clock CLK2. It is assumed that the high level of these signals is the high potential VH and the low level thereof is a low potential VL. OUT1 is an output of the present stage of the shift register, and OUT2 is an output of a next stage (not shown) of the shift register (see FIG. 18).

Figure 17:
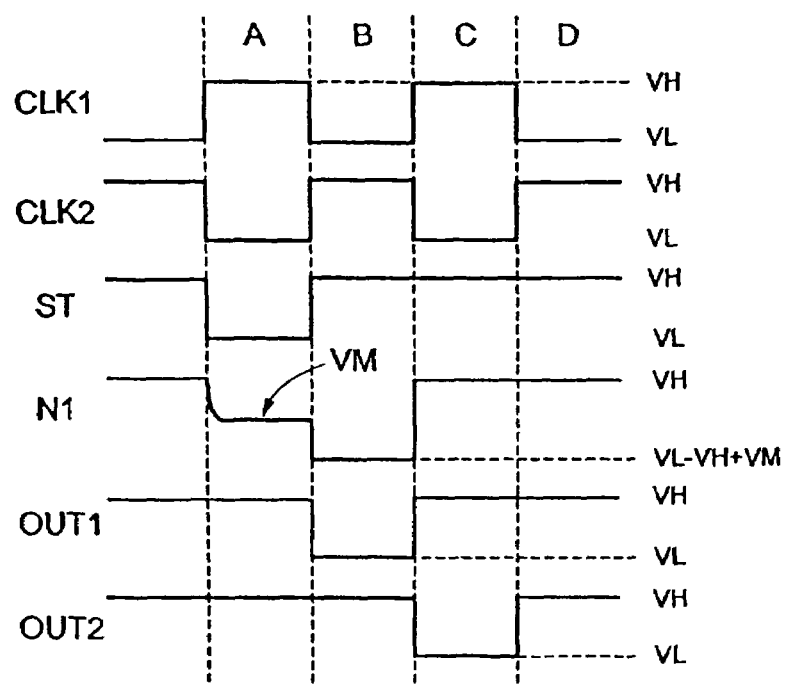
FIG. 17 is a timing chart showing an operation of the circuit of FIG. 16.

As shown in FIG. 17, the bootstrap circuit of the single stage of the shift register circuit is driven. During a period A, when the start pulse ST is at the low potential VL, the transistor 22 is brought into conduction, and the potential of the node N1 is made equal to the potential VM of the power source. Since CLK1 is at the high potential VH, the transistor 21 is in a conductive state. Moreover, since CLK2 is at the low potential VL, the transistor 23 is in a conductive state. Accordingly, the high potential VH is outputted from the output OUT1. The coupling capacitor 25 is charged to a voltage of (VH−VM).

Next, during a period B, when CLK2 rises to the high potential VH, the transistor 23 is brought into a non-conductive state. When CLK1 falls to the low potential VL, the potential of the output OUT1 is lowered to the low potential VL with the transistor 21 kept in the conductive state. At this time, if the start pulse ST is at the high potential VH, the transistor 22 is in a non-conductive state, and therefore the node N1 is brought into a floating state. Accordingly, based on the voltage with which the coupling capacitor 25 is charged, the potential of the node N1 drops below the low potential VL as the potential of the output OUT1 decreases. If the charges stored in the coupling capacitor 25 are not distributed, the potential of the node N1 drops down to (VL−VH+VM).

During a period C, since the transistor 23 is brought into conduction because of the low potential of CLK2, the high potential is outputted as OUT1. At this time, since the OUT2 which is inputted from the next stage of the shift register and is applied to the gate electrode of the transistor 24, is at the low potential VL, the transistor 24 is in a conductive state, and the potential of the node N1 rises to the high potential VH. As a result, the transistor 21 is brought into a non-conductive state. Since both the output OUT1 and the node N1 are at the high potential, the coupling capacitor 25 is not charged. As a result, during a period D, even if CLK1 falls to the low potential, the bootstrap effect of the transistor 21 does not function, and therefore the output OUT1 remains unchanged.

Hereinafter, the largest voltage that could be applied to the transistors while the circuit is operating will be considered. The maximum voltage that is used or generated in the circuit is the high potential VH, and the minimum voltage is (VL−VH+VM), which is the potential of the node N1 dropping due to the bootstrap effect. During the period B, the maximum potential and the minimum potential are applied between the source and drain electrodes of the transistor 24. Further, during a period of transition from the period B to the period C, there is a possibility that the maximum potential and the minimum potential are applied to the source electrode (OUT1) and gate electrode (N1) of the transistor 21, respectively. Therefore, the transistors constituting the circuit are required to have a withstand voltage of (2VH−VL−VM) between the source and drain electrodes and between the gate and source electrodes.

However, since this required value does not depend on the threshold voltage of a transistor, neither an increase in the required value nor a decrease in the design margin are caused by manufacturing variations in threshold voltage and the like. Accordingly, it is possible to manufacture a semiconductor device with higher reliability.

In the embodiment described above, although the circuit including the bootstrap circuit is formed using PMOS transistors, the conductivity type of the transistors is not limited to the P type. In other words, even in the case of using NMOS transistors, it is possible to configure a shift register in which the bootstrap circuit shown in the fourth embodiment is used for an output section.

Figure 18:
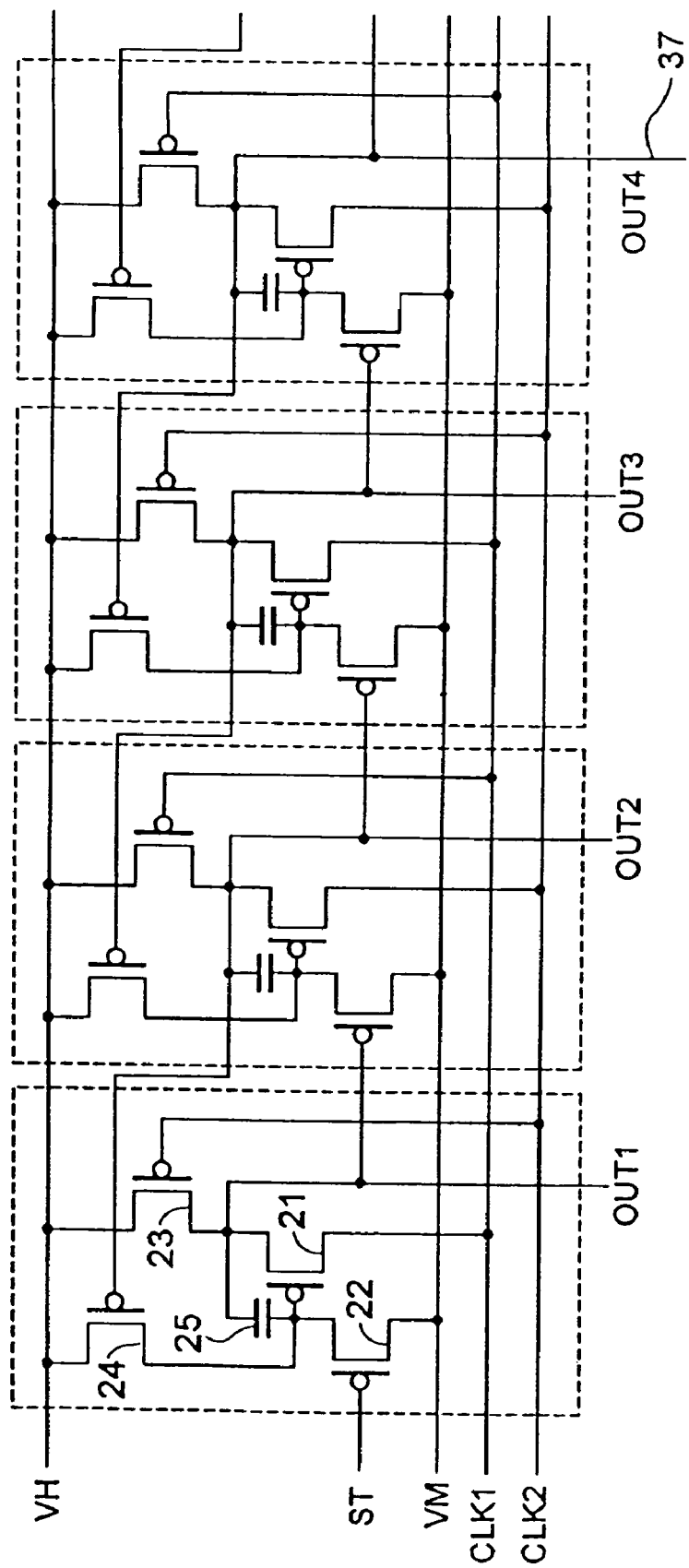
FIG. 18 is a diagram showing an example of a scanning line drive circuit using the shift register circuit of FIG. 16.

As shown in FIG. 18, a scanning line drive circuit 33 is a circuit in which as many the shift register stages as shown in FIG. 16 as the number of scanning lines are connected in series. In the second and subsequent stages of this shift register, each stage inputs as the start ST the output of the preceding stage. The inputs of the clocks CLK1 and CLK2 are alternately reversed with each succeeding stage. Thus, at the cue of the low potential of the start pulse ST, pulses at the low potential, synchronized with the clocks, are sequentially outputted from the outputs OUT1, OUT2, OUT3, . . . , of the respective stages of the shift register.

Figure 19:
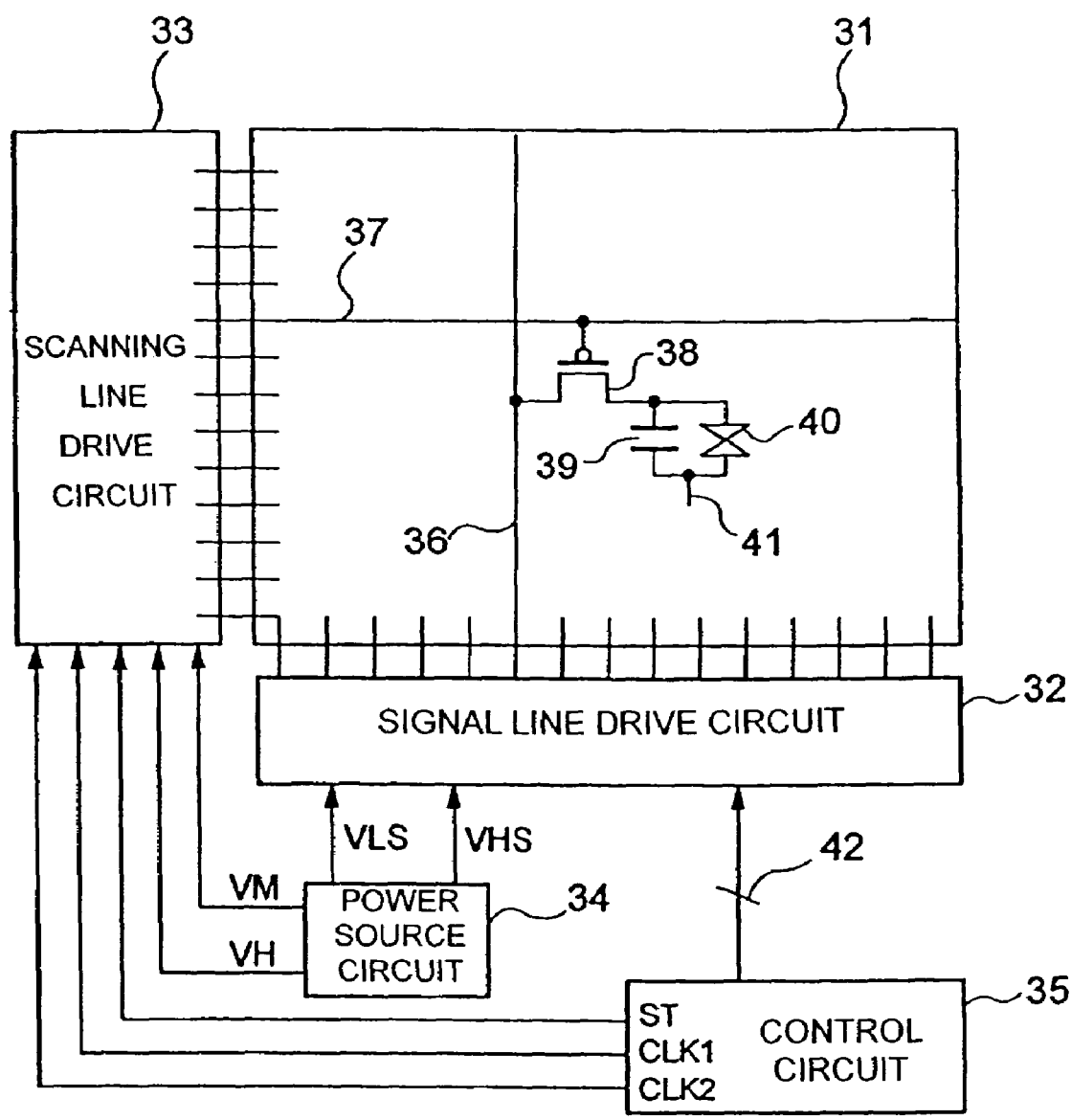
FIG. 19 is a diagram showing an example of a display device using a scanning line drive circuit according to the present invention.

As shown in FIG. 19, the scanning line drive circuit 33 is applicable to a semiconductor matrix device, for example, a display device. This display device includes a display section 31, a signal line drive circuit 32, the scanning line drive circuit 33, a power source circuit 34, a control circuit 35, and others. The display section 31 is composed of a two-dimensional array of pixel element 40 (for example, liquid crystal), each of which is connected to a pixel capacitor 39 and pixel transistor 38. Each pixel transistor 38 is connected to a signal line 36 and a scanning line 37. The scanning line drive circuit 33 drives a selected one of the scanning lines 37 and the signal line drive circuit 32 inputs a pixel signal from a selected pixel through a corresponding signal line 36.

Consider the display device as structured shown in FIG. 19, where the pixel transistors 38 and the scanning line-drive circuit 33 plus the signal line drive circuit 32, the power source circuit 34, the control circuit 35, and the like are integrally formed on a substrate by using a TFT technique of forming transistor elements on an insulated substrate. In this case, if the circuits are designed using single-conductivity-type (P-channel or N-channel) MOS transistors only, then the manufacturing processes can be simplified, and hence the manufacturing costs can be reduced. At this time, even in the case of using elements having wide manufacturing variations in transistor threshold voltage, such as amorphous silicon TFTs or polycrystalline silicon TFTs, the application of the present invention makes it possible to obtain a display device with high reliability.

To drive the display device, a plurality of power sources are used such as power sources VH and VL that supply power to the scanning line drive circuit 33 and power sources VHS and VLS that supply power to the signal line drive circuit 32. In the case of VL<VH and VLS<VHS, the following relation in magnitude can be generally obtained: VL<VLS<VHS<VH. The reason is as follows. In FIG. 19, to write a signal of the potential VLS onto the pixel element 40 from the signal line 36, the potential of the scanning line 37 connected to the gate of the transistor 38 needs to be set to VL, which is lower than VLS, so as to bring the PMOS transistor 38 into conduction. Moreover, when a signal of the potential VHS is written onto another pixel, it is necessary to prevent the writing on the pixel element 40. Accordingly, the potential of the scanning line 37 needs to be set to VH, which is higher than VHS, so as to bring the PMOS transistor 38 out of conduction.

When the present invention is applied to the scanning line drive circuit 33 composed of a shift register that outputs the high potential VH and the low potential VL, another power source is required that outputs an intermediate potential between VH and VL. However, as mentioned above, the power sources VLS and VHS that satisfy the relation of VL<VLS<VHS<VH are already used in the display device. Therefore, the shared use of one of these power sources VLS and VHS for the intermediate potential will eliminate the need to add a special power source.

6. Sixth Embodiment

A bootstrap circuit according to the present invention may be applied to various logical operation circuits. Hereinafter, as a sixth embodiment of the present invention, an AND circuit will be described with reference to the accompanying drawings.

Figure 20:
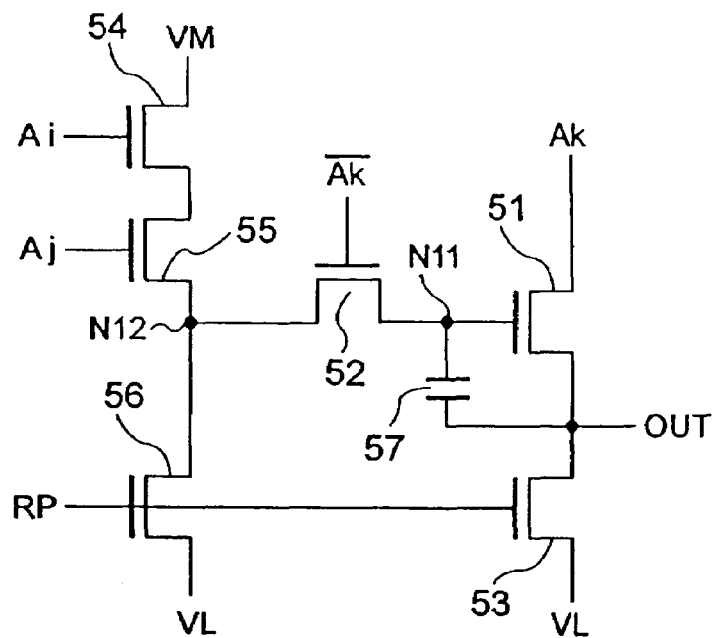
FIG. 20 is a diagram showing an example of an AND circuit according to the present invention.

FIG. 20 shows an AND circuit composed of NMOS transistors to which the present invention is applied. The present circuit has a function of outputting a high potential VH as an output OUT when three inputs Ai, Aj and Ak are all at the high potential VH, and of outputting a low potential VL otherwise.

The present circuit includes an output transistor 51 that produces a bootstrap effect, a transistor 52 that applies an initial potential to the gate electrode (node N11) of the transistor 51, a coupling capacitor 57, a transistor 53 for outputting the low potential VL, transistors 54 and 55 that receive as gate inputs selection signals Ai and Aj, respectively, and a transistor 56 for resetting a node N12.

The input Ak is inputted to the drain of the output transistor 51, and reset pulse RP is inputted to the gate electrodes of the transistors 53 and 56. Moreover, a potential VM of an intermediate power source (not shown) is inputted to the transistor 54. Here, it is assumed that the potential VM of the intermediate power source satisfies VL<VM<VH, and that each transistor is brought into conduction when the gate-source voltage thereof is equal to or greater than VH−VM or when it is equal to VM−VL.

Figure 21:
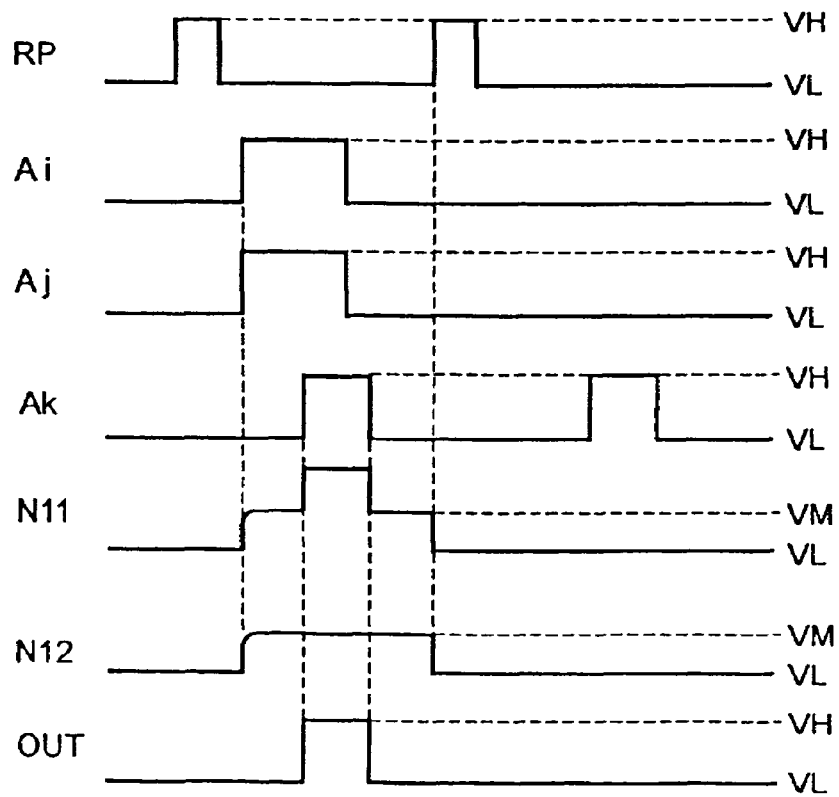
FIG. 21 is a timing chart showing an operation of the circuit of FIG. 20.

FIG. 21 shows an operation timing chart when the AND circuit outputs the high potential and when it outputs the low potential. First, when the high potential VH is inputted to the reset pulse RP, since the transistor 53 is brought into a conductive state, the low potential VL is outputted from the output OUT. Further, since the transistor 56 is also brought into a conductive state, the potential of the node N12 also becomes the low potential VL. Next, when the high potential is inputted to Ai and Aj of the selection signals, the transistors 54 and 55 are brought into conduction. Accordingly, the potential of the node N12 changes to the potential VM of the intermediate power source. At the same time, since the inverse of the selection signal $\overline{Ak}$ is at the high potential, the initial potential of the node N11 also becomes VM. At this time, the coupling capacitor 57 is charged to a voltage of VM−VL.

When the selection signal Ak rises from the low potential to the high potential, the output OUT also increases to the high potential due to the bootstrap effect of the transistor 51 being in the conductive state. Meanwhile, since $\overline{Ak}$ is at the low potential, the transistor 52 is in a non-conductive state, causing the node N11 to be in a floating state. Therefore, the potential of the node N11 rises above the high potential VH because of the coupling by the coupling capacitor 57. At this time, the rising potential of the node N11 is limited to (VH−VL+VM) at the maximum and does not depend on the threshold voltage of the transistors.

Next, the case where Ai or Aj of the selection signals is non-selective will be described. The reset pulse RP brings the transistor 53 into the conductive state and thereby the output OUT becomes the low potential VL. Moreover, since the potentials of the nodes N12 and N11 do not change from the low potential VL, the transistor 51 remains in the non-conductive state. Therefore, even if the selection signal Ak rises to the high potential, the bootstrap effect of the transistor 51 does not function, and the output OUT does not change to the high potential VH.

The AND circuit described in the above embodiment can be used, for example, as an address decoder of a semiconductor memory device. Specifically, by using the AND circuit, a decoder circuit is configured to output the high potential VH upon a specific combination of selection signals, not limited to the three kinds. Then, a plurality of these decoder circuits are combined to form an address decoder, which can select a memory cell to read data from and write data onto the selected one.

Additionally, applications of the present invention include a semiconductor device using a bootstrap circuit; a mobile terminal or mobile telephone incorporating, for example, a display device having an active matrix; an optical fingerprint reader incorporating a two-dimensional sensor device; and also a semiconductor memory device having an address decoding function.

The invention claimed is:

1. A bootstrap circuit comprising:
an output transistor having first and second main electrodes and a gate electrode,
wherein the bootstrap circuit provides bootstrapping of high potential (VH) or low potential (VL) outputs on the first main electrode of the output transistor by use of capacitance existing between the first main electrode and the gate electrode of the output transistor,
the bootstrap circuit further comprising:
a first power source having a first potential different from both VH and VL; and
a first circuit for controlling supply of the first potential to the gate electrode of the output transistor.

2. The bootstrap circuit according to claim 1, wherein the first potential is set to a potential that, when supplied to the gate electrode by the first circuit, is sufficient to bring the output transistor into conduction with respect to a potential of the first main electrode.

3. The bootstrap circuit according to claim 2, wherein the first circuit controls such that the supply of the first potential to the gate electrode is provided during a first period and is cut off during a second period following the first period.

4. The bootstrap circuit according to claim 2, further comprising:
a second power source for supplying a second potential to the gate electrode of the output transistor; and
a second circuit for controlling supply of the second potential to the gate electrode of the output transistor.

5. The bootstrap circuit according to claim 4, wherein the second potential is set to a potential that, when supplied to the gate electrode by the second circuit, is sufficient to bring the output transistor out of conduction with respect to a potential of the first main electrode.

6. The bootstrap circuit according to claim 5, wherein
the first circuit controls such that the supply of the first potential to the gate electrode is provided during a first period and is cut off during a second period following the first period, and
the second circuit controls such that the supply of the second potential to the gate electrode is provided during a third period that does not overlap with the first and second periods, and is cut off during a fourth period following the third period.

7. The bootstrap circuit according to claim 1, further comprising:
a second power source for supplying a second potential to the gate electrode of the output transistor; and a second circuit for controlling supply of the second potential to the gate electrode of the output transistor.

8. The bootstrap circuit according to claim 7, wherein the second potential is set to a potential that, when supplied to the gate electrode by the second circuit, is sufficient to bring the output transistor out of conduction with respect to a potential of the first main electrode.

9. The bootstrap circuit according to claim 7, wherein the output transistor is a N-channel insulated gate transistor that outputs any one of a high potential VH and a low potential VL, wherein the second potential of the second power source is the low potential VL and the first potential of the first power source is higher than the low potential VL, wherein the output transistor is brought out of conduction when the potential of the gate electrode is equal to the low potential VL.

10. A shift register circuit comprising an output section which comprises the bootstrap circuit according to claim 7.

11. A semiconductor integrated circuit, wherein the shift register circuit according to claim 10 is used for a scanning line drive circuit.

12. A logical operation circuit comprising an output section which comprises the bootstrap circuit according to claim 7.

13. The bootstrap circuit according to claim 1, wherein the output transistor is a P-channel insulated gate transistor that outputs any one of a high potential VH and a low potential VL, the first circuit comprises a P-channel insulated gate transistor, and the potential of the first power source is higher than the low potential VL.

14. The bootstrap circuit according to claim 1, wherein the output transistor is a first P-channel insulated gate transistor that outputs any one of a high potential VH and a low potential VL, the first circuit comprises a second P-channel insulated gate transistor, and the first potential of the first power source is higher than the low potential VL by at least 0.5 V.

15. The bootstrap circuit according to claim 1, wherein at least one transistor constituting the bootstrap circuit is a thin-film transistor.

16. The bootstrap circuit according to claim 1 wherein the first circuit comprises a PMOS transistor having a minimum threshold voltage Vthmin, and
the first power source has a first potential greater than (VL-Vthmin).

17. The bootstrap circuit according to claim 1 wherein the first circuit comprises an NMOS transistor having a maximum threshold voltage Vthmax, and
the first power source has a first potential less than (VH-Vthmax).

18. A bootstrap circuit comprising:
an output transistor having first and second main electrodes and a gate electrode,
wherein the bootstrap circuit provides bootstrapping of an output on the first main electrode of the output transistor by use of capacitance existing between the first main electrode and the gate electrode of the output transistor, the bootstrap circuit further comprising:
a first power source for supplying a first potential to the gate electrode of the output transistor;
a first circuit for controlling supply of the first potential to the gate electrode of the output transistor;
a second power source for supplying a second potential to the gate electrode of the output transistor; and
a second circuit for controlling supply of the second potential to the gate electrode of the output transistor,
wherein the output transistor is a P-channel insulated gate transistor that outputs any one of a high potential VH and a low potential VL, wherein the second potential of the second power source is the high potential VH and the first potential of the first power source is lower than the high potential VH, wherein the output transistor is brought out of conduction when the potential of the gate electrode is equal to the high potential VH.

19. A bootstrap circuit comprising:
an output transistor having first and second main electrodes and a gate electrode,
wherein the bootstrap circuit provides bootstrapping of an output on the first main electrode of the output transistor by use of capacitance existing between the first main electrode and the gate electrode of the output transistor, the bootstrap circuit further comprising:
a first power source for supplying a first potential to the gate electrode of the output transistor; and
a first circuit for controlling supply of the first potential to the gate electrode of the output transistor,
wherein the output transistor is an N-channel insulated gate transistor that outputs any one of a high potential VH and a low potential VL, the first circuit comprises an N-channel insulated gate transistor, and the potential of the first power source is lower than the high potential VH.

20. A bootstrap circuit comprising:
an output transistor having first and second main electrodes and a gate electrode,
wherein the bootstrap circuit provides bootstrapping of an output on the first main electrode of the output transistor by use of capacitance existing between the first main electrode and the gate electrode of the output transistor, the bootstrap circuit further comprising:
a first power source for supplying a first potential to the gate electrode of the output transistor; and
a first circuit for controlling supply of the first potential to the gate electrode of the output transistor,
wherein the output transistor is a first P-channel insulated gate transistor that outputs any one of a high potential VH and a low potential VL, the first circuit comprises a second P-channel insulated gate transistor, a threshold value Vth of the second P-channel insulated gate transistor is greater than a minimum value of variations in threshold voltage, and the first potential of the first power source is greater than a difference between the low potential VL and the minimum value.

21. A bootstrap circuit comprising:
an output transistor having first and second main electrodes and a gate electrode,
wherein the bootstrap circuit provides bootstrapping of an output on the first main electrode of the output transistor by use of capacitance existing between the first main electrode and the gate electrode of the output transistor, the bootstrap circuit further comprising:
a first power source for supplying a first potential to the gate electrode of the output transistor; and
a first circuit for controlling supply of the first potential to the gate electrode of the output transistor,
wherein the output transistor is a first N-channel insulated gate transistor that outputs any one of a high potential VH and a low potential VL, the first circuit comprises a second N-channel insulated gate transistor, a threshold value Vth of the second N-channel insulated gate transistor is smaller than a maximum value of variations in threshold voltage, and the first potential of the first power source is smaller than a difference between the high potential VH and the maximum value.

22. A bootstrap circuit comprising:
an output transistor having first and second main electrodes and a gate electrode, wherein the bootstrap circuit provides bootstrapping of an output on the first main electrode of the output transistor by use of capacitance existing between the first main electrode and the gate electrode of the output transistor, the bootstrap circuit further comprising:

a first power source for supplying a first potential to the gate electrode of the output transistor; and a first circuit for controlling supply of the first potential to the gate electrode of the output transistor, wherein the output transistor is a first N-channel insulated gate transistor that outputs any one of a high potential VH and a low potential VL, the first circuit comprises a second N-channel insulated gate transistor, and the first potential of the first power source is lower than the high potential VH by at least 0.5 V.

23. A method for driving a bootstrap circuit comprising:

an output transistor having first and second main electrodes and a gate electrode, wherein the bootstrap circuit provides bootstrapping of high potential (VH) hormone potential (VL) outputs on the first main electrode of the output transistor by use of capacitance existing between the first main electrode and the gate electrode of the output transistor;

a first power source having a first potential different from both VH and VL; and a first circuit for controlling supply of the first potential to the gate electrode of the output transistor, the method comprising:

during a first period, supplying the first potential to the gate electrode by control of the first circuit; and during a second period following the first period, cutting off the supply of the potential by control of the first circuit.

24. The method according to claim 23, wherein the first potential is set to a potential that, when supplied to the gate electrode by the first circuit, is sufficient to bring the output transistor into conduction with respect to a potential of the first main electrode.

25. The driving method according to claim 24, wherein the bootstrap circuit further comprising: a second power source for supplying a second potential to the gate electrode of the output transistor; and a second circuit for controlling supply of the second potential to the gate electrode of the output transistor, the method further comprising:

providing the supply of the second potential to the gate electrode during a third period that does not overlap with the first and second periods; and cutting off the supply of the second potential to the gate electrode during a fourth period following the third period.

26. The driving method according to claim 25, wherein the second potential is set to a potential that, when supplied to the gate electrode by the second circuit, is sufficient to bring the output transistor out cif conduction with respect to a potential of the first main electrode.

27. The driving method according to claim 23, wherein the bootstrap circuit further comprising: a second power source for supplying a second potential to the gate electrode of the output transistor; and a second circuit for controlling supply of the second potential to the gate electrode of the output transistor, the method frirther comprising:

providing the supply of the second potential to the gate electrode during a third period that does not overlap with the first and second periods; and cutting off the supply of the second potential to the gate electrode during a fourth period following the third period.

28. The bootstrap circuit according to claim 23 wherein the first circuit comprises a PMOS transistor having a minimum threshold voltage Vthmin, and the first power source has a first potential greater than (VL-Vthmin).

29. The bootstrap circuit according to claim 23 wherein the first circuit comprises an NMOS transistor having a maximum threshold voltage Vthmax, and the first power source has a first potential less than (VH-Vthmax).

* * * * *